US012713791B2

(12) United States Patent
Li et al.

(10) Patent No.: US 12,713,791 B2
(45) Date of Patent: Aug. 18, 2026

(54) DISPLAY PANEL AND ELECTRONIC APPARATUS

(71) Applicant: WUHAN TIANMA MICRO-ELECTRONICS CO., LTD., Wuhan (CN)

(72) Inventors: Fei Li, Wuhan (CN); Lilian Kuang, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 380 days.

(21) Appl. No.: 18/427,045

(22) Filed: Jan. 30, 2024

(65) Prior Publication Data

US 2024/0172502 A1 May 23, 2024

(30) Foreign Application Priority Data

Jan. 31, 2023 (CN) ......................... 202310099142.7

(51) Int. Cl.
*H10K 59/131* (2023.01)

(52) U.S. Cl.
CPC .................................. *H10K 59/131* (2023.02)

(58) Field of Classification Search
CPC ............. H10K 59/131; H10K 59/1213; H10K 59/126; H10D 86/00; H10D 86/423; H10D 86/441; H10D 86/60
See application file for complete search history.

(56) References Cited

U.S. PATENT DOCUMENTS

| | | | | |
|---|---|---|---|---|
| 11,574,972 | B2 * | 2/2023 | Kang | H10D 86/441 |
| 2018/0190233 | A1 * | 7/2018 | Jang | G09G 3/3688 |
| 2021/0074783 | A1 | 3/2021 | Kang et al. | |
| 2022/0005913 | A1 * | 1/2022 | Xiao | H10D 86/443 |
| 2022/0037439 | A1 | 2/2022 | Lee et al. | |

(Continued)

FOREIGN PATENT DOCUMENTS

WO 2022104615 A1 5/2022

OTHER PUBLICATIONS

First Office Action (with English translation) received for Chinese Application No. 202310099142.7, filed Jan. 31, 2023; 23 pages total.

(Continued)

*Primary Examiner* — Dao H Nguyen
(74) *Attorney, Agent, or Firm* — Christensen O'Connor Johnson Kindness PLLC

(57) ABSTRACT

A display panel and an electronic apparatus are provided. The display panel includes a substrate, a first thin film transistor, a second thin film transistor, data lines data connecting lines, and pixel circuit groups. The first thin film transistor includes a silicon semiconductor pattern having a drain area, an active area and a source area, and a first gate. The second thin film transistor includes an oxide semiconductor pattern having a drain area, an active area and a source area, and a second gate. The data connecting lines transmit data signals to the data lines. Each pixel circuit group includes a first pixel circuit and a second pixel circuit that are at least partially symmetric with respect to an imaginary axis. The first data line and the second data line are arranged between the first pixel circuit and the second pixel circuit and are adjacent to each other.

20 Claims, 33 Drawing Sheets

(56) References Cited

U.S. PATENT DOCUMENTS

| | | | | |
|---|---|---|---|---|
| 2022/0285427 | A1* | 9/2022 | Son | G09G 3/3266 |
| 2023/0080385 | A1* | 3/2023 | Yuan | G09G 3/3648<br>345/87 |
| 2023/0326402 | A1* | 10/2023 | Zhang | G09G 3/32 |
| 2026/0033181 | A1* | 1/2026 | Zhang | H10K 59/131 |

OTHER PUBLICATIONS

Second Office Action (with English translation) dated Jan. 14, 2026 received for Chinese Application No. 202310099142.7, filed Jan. 31, 2023; 24 pages total.

* cited by examiner

DL2 CL01 VDD CL02 DL1 DL2 CL01 VDD CL02 DL1 DL2 CL01 VDD CL02 DL1

PX2

CL02-1

CL01-1

PX3

IL

CL03

CL03-2

IL

CL04

CL04-2

PX1

FIG. 17
00:00
January 1 Saturday 2023
Tenth day of twelfth lunar month

DISPLAY PANEL AND ELECTRONIC APPARATUS

CROSS-REFERENCE TO RELATED DISCLOSURE

The present application claims priority to Chinese Patent Disclosure No. 202310099142.7, filed on Jan. 31, 2023, the content of which is incorporated herein by reference in its entirety.

TECHNICAL FIELD

The present disclosure relates to the field of display technologies, and, particularly, relates to a display panel and an electronic apparatus.

BACKGROUND

An organic light-emitting diode (OLED) device, as a new type of flat panel display technology, has characteristics of self-emission, wide viewing angle, fast response speed and flexibility and becomes a new generation of display technology.

However, with the continuous development of the display technology, a screen-to-body ratio is constantly increasing, an edge size is also constantly decreasing, and the edge space is constantly reduced. At present, signal lines extending from a driving chip into a display area occupy a large part of the edge space, and these signal lines are in a fan-out design. However, the space required by the fan-out design is difficult to be further reduced in a non-display area, which cannot meet the narrow bezel design.

SUMMARY

One aspect of the present disclosure provides a display panel. The display panel includes: a substrate including a display area and a pad area, a first thin film transistor, a second thin film transistor, data lines extend along a first direction in the display area, data connecting lines configured in the display area and located at a side of the second gate away from the substrate, and pixel circuit groups arranged along the first direction and a second direction in the display area.

The first thin film transistor includes: a silicon semiconductor pattern having a drain area, an active area and a source area, and a first gate overlapped with the active area of the silicon semiconductor pattern.

The second thin film transistor includes: an oxide semiconductor pattern having a drain area, an active area and a source area, and a second gate overlapped with the active area of the oxide semiconductor pattern.

The data connecting lines are connected to the data lines and transmit data signals from the pad area to the data lines.

Each of the pixel circuit groups includes a first pixel circuit and a second pixel circuit. The first pixel circuit and the second pixel circuit are at least partially symmetric with respect to an imaginary axis arranged between the first pixel circuit and the second pixel circuit.

The first pixel circuit is connected to a first data line of the data lines, and the second pixel circuit is connected to a second data line of the data lines. For each pixel circuit group, the first data line and the second data line are arranged between the first pixel circuit and the second pixel circuit and are adjacent to each other.

Another aspect of the present disclosure provides a display panel. The display panel includes: a substrate including a display area and a pad area, a first thin film transistor, a second thin film transistor, data lines extend along a first direction in the display area, data connecting lines configured in the display area and located at a side of the second gate away from the substrate, and pixel circuit groups arranged along the first direction and a second direction in the display area.

The first thin film transistor includes a silicon semiconductor pattern having a drain area, an active area and a source area, and a first gate overlapped with the active area of the silicon semiconductor pattern.

The second thin film transistor includes an oxide semiconductor pattern having a drain area, an active area and a source area, and a second gate overlapped with the active area of the oxide semiconductor pattern.

The data connecting lines are connected to the data lines and transmit data signals from the pad area to the data lines.

Each of the pixel circuit groups includes a first pixel circuit and a second pixel circuit, and the first pixel circuit and the second pixel circuit are at least partially symmetric with respect to an imaginary axis passing between the first pixel circuit and the second pixel circuit, The data connecting lines include a first data connecting line and a second data connecting line both extending in a same direction as the data lines. The first data connecting line is configured in the first pixel circuit area, the second data connecting line is configured in the second pixel circuit area, and the first data connecting line and the second data connecting line are arranged between two adjacent pixel circuit groups and are adjacent to each other. Or, the first pixel circuit is connected to a first data line of the data lines, and the second pixel circuit is connected to a second data line of the data lines. The first data line and the second data line are arranged between two adjacent pixel circuit groups and are adjacent to each other.

Yet another aspect of the present disclosure provides a display panel. The display panel includes: a substrate including a display area and a pad area, a first thin film transistor, a second thin film transistor, data lines extend along a first direction in the display area, data connecting lines configured in the display area and located at a side of the second gate away from the substrate, and pixel circuit groups configured along the first direction and a second direction in the display area.

The first thin film transistor includes a silicon semiconductor pattern having a drain area, an active area and a source area, and a first gate overlapped with the active area of the silicon semiconductor pattern.

The second thin film transistor includes an oxide semiconductor pattern having a drain area, an active area and a source area, and a second gate overlapped with the active area of the oxide semiconductor pattern.

The data connecting lines are connected to the data lines and transmit data signals from the pad area to the data lines.

Each of the pixel circuit groups includes a first pixel circuit and a second pixel circuit, and the first pixel circuit and the second pixel circuit are at least partially symmetric with respect to an imaginary axis passing between the first pixel circuit and the second pixel circuit.

The data connecting lines include a first data connecting line and a second data connecting line both extending in a same direction as the data lines. The first data connecting line is configured in the first pixel circuit area, and the second data connecting line is configured in the second pixel circuit area. The first data connecting line and the second data connecting line are arranged between the first pixel circuit and the second pixel circuit and are adjacent to each other.

Still another aspect of the present disclosure provides an electronic apparatus. The electronic apparatus includes the display panel as described in the above aspects.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings.

DESCRIPTION OF EMBODIMENTS

Figure 1:
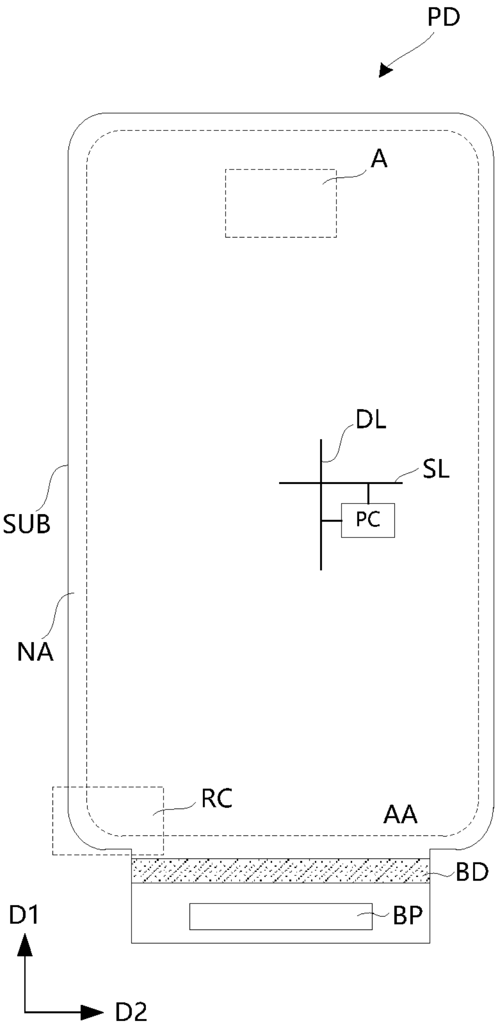
FIG. 1 is a plan view of a display panel according to an embodiment of the present disclosure.

In order to more clearly illustrate objectives, technical solutions, and advantages of the embodiments of the present disclosure, the technical solutions in the embodiments of the present disclosure are clearly and completely described in details with reference to the accompanying drawings. The described embodiments are merely part of the embodiments of the present disclosure rather than all of the embodiments. All other embodiments obtained by those skilled in the art based on the embodiments of the present disclosure shall fall into the protection scope of the present disclosure. Therefore, the present disclosure should not be construed to be limited to what is recorded in the embodiments below. The embodiments in the present disclosure and the features in the embodiments can be combined with each other without conflict.

The terms used in the embodiments of the present disclosure are merely for the purpose of describing specific embodiment, rather than limiting the present disclosure. The terms "a", "an", "the" and "said" in a singular form in the embodiment of the present disclosure and the attached claims are also intended to include plural forms thereof, unless noted otherwise.

In the drawings, a size of a constituent element, a thickness of a layer or an area of the layer may be sometimes exaggerated for clarity. Therefore, any implementation mode of the present disclosure is not necessarily limited to sizes shown in the drawings, and the shapes and sizes of the components in the drawings do not reflect true proportions. In addition, the drawings schematically show ideal examples, and any implementation mode of the present disclosure is not limited to the shapes or values shown in the drawings.

Ordinal words such as "first" and "second" in this disclosure are provided in order to avoid confusion of components, rather than limited in terms of quantity or name. The term "multiple" in the present disclosure means two or more.

In the present disclosure, the terms "connected", and "coupled" shall be broadly understood unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. Those of ordinary skills in the art may understand meanings of the above terms in the present disclosure according to a situation.

In this disclosure, the term "electrical connection" includes a case where constituent elements are connected via an element having a certain electrical function. The "element with a certain electrical function" is not particularly limited as long as electrical signals may be transmitted and received between connected constituent elements. An "element with a certain electrical function" may be, for example, an electrode or a wiring, a switching element such as a transistor, or other functional elements such as a resistor, an inductor, or a capacitor.

In this disclosure, a transistor refers to an element that includes at least three terminals: a gate, a drain, and a source. The transistor has a channel area between the drain (or referred to as a drain terminal, a drain area, or a drain electrode) and the source (or referred to as a source terminal, a source area, or a source electrode), and a current may flow through the drain electrode, the channel area, and the source electrode. In the present disclosure, the channel area refers to an area through which a current mainly flows.

In this disclosure, the first electrode may be a drain electrode and the second electrode may be a source electrode, or the first electrode may be a source electrode and the second electrode may be a drain electrode. Functions of a source electrode and a drain electrode might be switched when a transistor of opposite polarity is employed or the direction of current flow is changed in circuit operation, for example. Therefore, the terms "source" and "drain" can be switched in some cases in this disclosure and the like.

In this disclosure, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

The terms "substantially" and "roughly" used in the present disclosure refer to situations where the limits are not strictly defined and within allowed process and error of measurement. In the present disclosure, "roughly the same" means the situation in which the values differ within 10%.

The display panel described in the present disclosure can include a liquid crystal display panel, an electrophoretic display panel, an organic light-emitting display panel, an inorganic electroluminescent (EL) display panel, a field emission display panel, a surface-conducting electron emission display panel, a quantum dot display panel, a plasma display panel, or a cathode-ray display panel. Although the organic light-emitting display panel is described as an example, the present disclosure can be applied to various types of display devices in the description below.

The drawings of the embodiments of the present disclosure, for example, the drawing of the pixel circuit, not only show structural diagrams of its components, but further contain repeated thin film transistors due to complexity of signal lines. Just to ensure continuity, the arrangement relation of various thin film transistors, signal lines and storage capacitors can be understood more clearly. In addition, repeated thin film transistors, signal lines, and storage capacitors were not repeatedly marked.

In the present disclosure, "adjacent to" means that signal lines of the same type, such as data lines or data connecting lines, are spatially closer in position compared with other types of signal lines, i.e., data line to data line, data connecting line to data connecting line. That is to say, signal lines in one group are of the same type. For example, one group of signal lines includes two signal lines, and the two signal lines in this group are both data lines or both data connecting lines, which is different from arrangement that one group includes a data line and a data connecting line in the related art. In other words, in the related art, e.g., one group of signal lines includes two signal lines, one signal line is a data line, and the other is a data connecting line.

FIG. 1 is a plan view of a display panel according to an embodiment of the present disclosure. Referring to FIG. 1, a display panel PD includes a substrate SUB, and a display area AA and a non-display area NA that are disposed on the substrate SUB. The non-display area NA at least partially surrounds the display area AA. Exemplarily, the non-display area NA further includes a convex portion along a first direction. The convex portion includes a pad area BP. The pad area BP is an area electrically connected to various electronic devices or printed circuit boards. Multiple terminals in the pad area BP can be electrically connected to a data driver. In some embodiments of the present disclosure, the data driver for supplying a data signal can be arranged, by a chip-on-film (COF) method, on terminals that are electrically connected to the pad area BP. The data driver can also be directly arranged on the substrate SUB by a chip-on-glass (COG) method or a chip-on-plastic (COP) method. The non-display area NA can further include a bending area BD. The bending area BD can be located between the display area AA and the pad area BP. In this way, the convex portion can be bent to a side facing away from a light-emitting direction through the bending area BD. That is, the pad area at least partially overlaps with the display area AA. The pad area BP does not cover the display area AA, achieving the purpose of narrow bezel.

The display area AA can have a rectangle-like or rounded rectangle shape. Exemplarily, the corner of the display area AA can have a rounded shape. Exemplary, as shown by a corner area RC, the four corners of the display panel PD all have a rounded shape, and the pad area BP is adjacent to the corner. However, the present disclosure is not limited thereto. Other portions on the edge of the display area can further have a rounded shape.

The display area AA includes pixel units functioning as display elements. Each pixel unit may include sub-pixels that emit lights such as red, green, blue or white light. Furthermore, each pixel unit further includes a pixel circuit PC such as a thin film transistor and a storage capacitor.

The signal lines that supply electric signals to the pixel units may include multiple scan lines SL or multiple data lines DL, etc. Each data line DL can extend from the non-display area NA to the display area AA in a first direction, and also extend in the first direction in the display area AA. Each scan line SL can extend in a second direction. The first direction crosses the second direction. Each scan line SL can be configured to transmit a scan signal to the pixel unit. Each data line DL can be configured to transmit a data signal to the pixel unit. Each pixel can be connected to at least one scan line SL and a corresponding data line DL of the multiple data line DL.

The display area AA further includes multiple data connecting lines CL connecting multiple data lines DL respectively. The data connecting lines CL are configured to transmit the data signals from the pad area BP to the multiple data lines DL.

Figure 2:
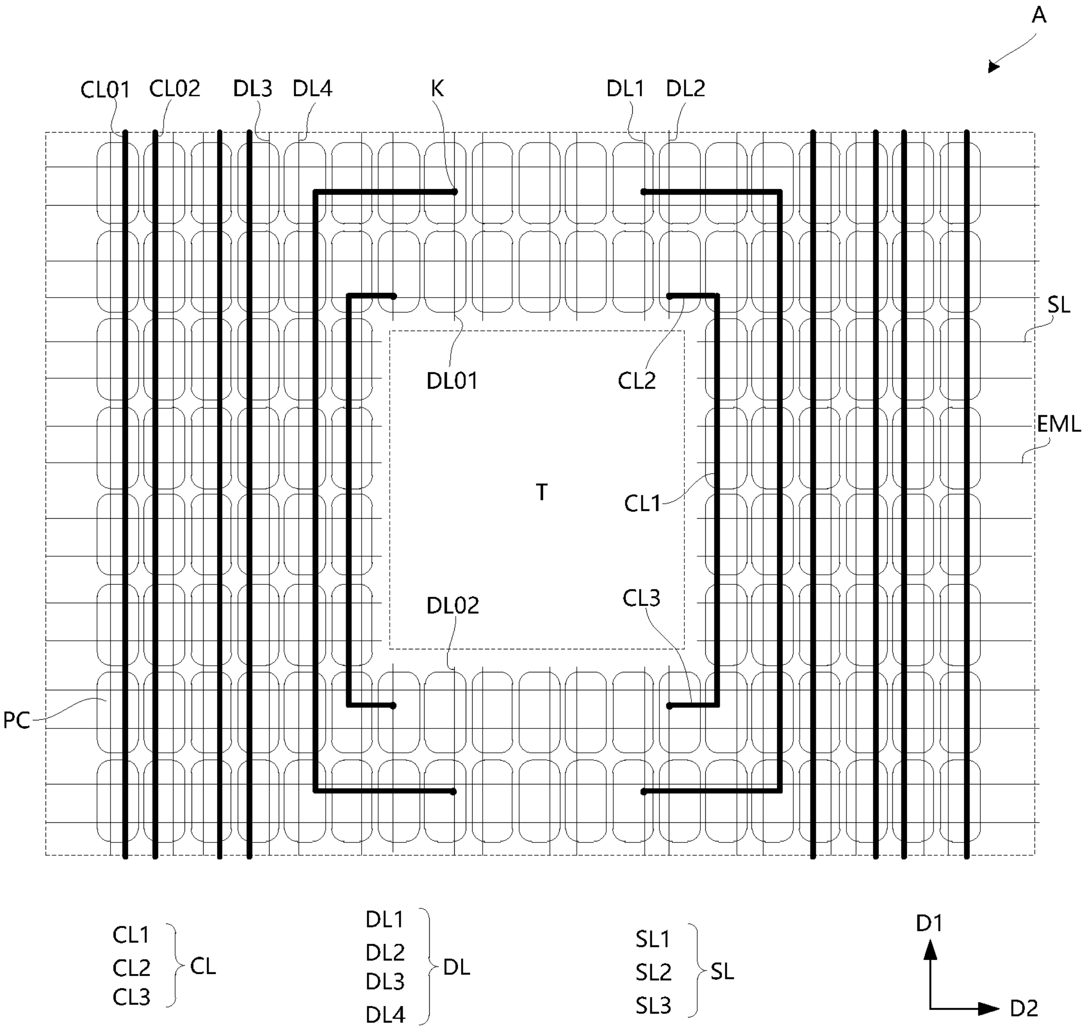
FIG. 2 is an enlarged plan view of an area A shown in FIG. 1 according to an embodiment of the present disclosure.

FIG. 2 is an enlarged plan view of an area A shown in FIG. 1. In some embodiments, referring to FIG. 2, the display panel includes a light transmitting area T. The display area AA may be disposed on at least one side of the light transmitting area T, e.g., the display area AA partially surrounds the light transmitting area T, or the display area AA may completely surround the light transmitting area T. FIG. 2 only shows an example and does not limit the present disclosure. The light transmitting area T has a higher transmittance than the display area AA. The light transmitting area T can have a transmittance of 20% to 100%, e.g. 100%, 90%, 80%, 60%, 35%, and so on. The light transmitting area T can achieve complete light transmitting by a form of a through hole or "virtual" hole, or can have a resolution smaller than or equal to that of a conventional display area. For example, the display area AA includes a first display area and the light transmitting area T. The pixels of the first display area have a first resolution, the pixels of the light transmitting area T have a second resolution, and the first resolution is greater than or equal to the second resolution. The pixel arrangement in the light transmitting area may be the same as the pixel arrangement in the first display area, or may be a different arrangement such as a diamond arrangement, a π arrangement, a strip arrangement and the like, which are not limited thereto. Moreover, the light transmitting area T a shape of a circle, an ellipse, a triangle, a quadrilateral and other polygons.

In some embodiments of the present disclosure, at least one of the following electronic components, such as cameras, luminance sensors, proximity sensors, iris sensors, etc., can be disposed under the light transmitting area T.

FIG. 2 shows a connecting manner of data lines. In order to further increase the transmittance of the light transmitting area T, the pixel circuit PC is not disposed in the light transmitting area. The data line DL extending in a first direction is disconnected by the transmittal area T. The data line DL is divided into two data line segments, i.e., a first data line segment DL01 located at a side of the light transmitting area T away from the pad area BP, and a second data line segment DL02 located at a side of the light transmitting area T adjacent to the pad area BP. The data connecting line CL includes a first data connecting line CL1, a second data connecting line CL2 and a third data connecting line CL3. The first data connecting line CL1, the second data connecting line CL2 and the third data connecting line CL3 are connected to one another. One end of the first data connecting line CL1 is connected to the first data line segment DL01, and one end of the third data connecting line CL3 is connected to the second data line segment DL02, so that the first data line segment DL01 and the second data line segment DL02 form a conductive path. The first data line segment DL01 and the second data line segment DL02 are connected by the data connecting lines, so that the data signal is transmitted from the pad area BP to the first data line segment DL01. The first data connecting line CL1 is located at an upper side of the center of the light transmitting area T, and the third data connecting line CL3 is located at a lower side of the center of the light transmitting area T. The first data connecting line CL1 can be disposed parallel to the data line DL, and can partially overlap with or be adjacent to the data line DL. The first data connecting line CL1 of the data connecting line CL is arranged in a pixel column and extends parallel to the data line DL. The second data connecting line CL2 of the data connecting line CL may be parallel to the scan line SL, and may partially overlap with or be adjacent to the scan line SL. The third data connecting line CL3 of the data connecting line CL may be parallel to the scan line SL, and may partially overlap with or be adjacent to the scan line SL.

The data lines may include a first data line DL1, a second data line DL2, a third data line DL3, and a fourth data line DL4. The first data line DL1 and the second data line DL2 are cut off by the light transmitting area T, and are electrically connected to the data connecting lines CL through vias K respectively, so as to achieve the transmission of the data signal in the pad area BP. The third data line DL3 and the fourth data line DL1 are the data lines other than the first data line DL1 and the second data line DL2, that is, the third data line DL3 and the fourth data line DL3 are electrically connected to the pad area BP without the data connecting line CL.

Furthermore, in adjacent pixel columns, the data lines may be disposed adjacent to one another. For example, the first data line DL1 is adjacent to the second data line DL2, and the third data line DL3 is adjacent to the fourth data line DL4.

In some embodiments of the present disclosure, in adjacent pixel columns, the data connecting lines may be disposed adjacent to one another, e.g., a first data connecting sub-line CL01 is adjacent to a second data connecting sub-line CL02. The first data connecting line CL1 of the data connecting lines CL may be a portion of the first data connecting sub-line CL01. For example, the first data connecting sub-line CL01 may include the first data connecting line CL1 and a first data connecting dummy line CL-1 (to highlight the relationship between data connecting lines, the view is simplified, the first data connecting dummy line is not shown). The first data connecting dummy line CL-1 is located on the extension line of the first data connecting line CL1. The first data connecting extension line CL-1 is disconnected from the first data connecting line CL1 at the position where the first data connecting line CL1 and the second data connecting line CL2 are connected. The first data connecting extension line can be connected to a fixed potential, e.g., any one of a supply voltage signal (PVDD), a cathode voltage signal (PVEE), a reset voltage signal (VREF), etc.

Pairs of adjacent data lines and pairs of adjacent data connecting lines may be arranged alternately along a row direction (a second direction).

In this way, the data lines are not disposed in the light transmitting area T, so that the light transmittance of the light transmitting area T can be further improved, thereby further improving photographing effect of the camera. Meanwhile, disposing the data connecting line CL in the display area can further reduce the bezel at the light transmitting area T and increase screen-to-body ratio.

Figure 3:
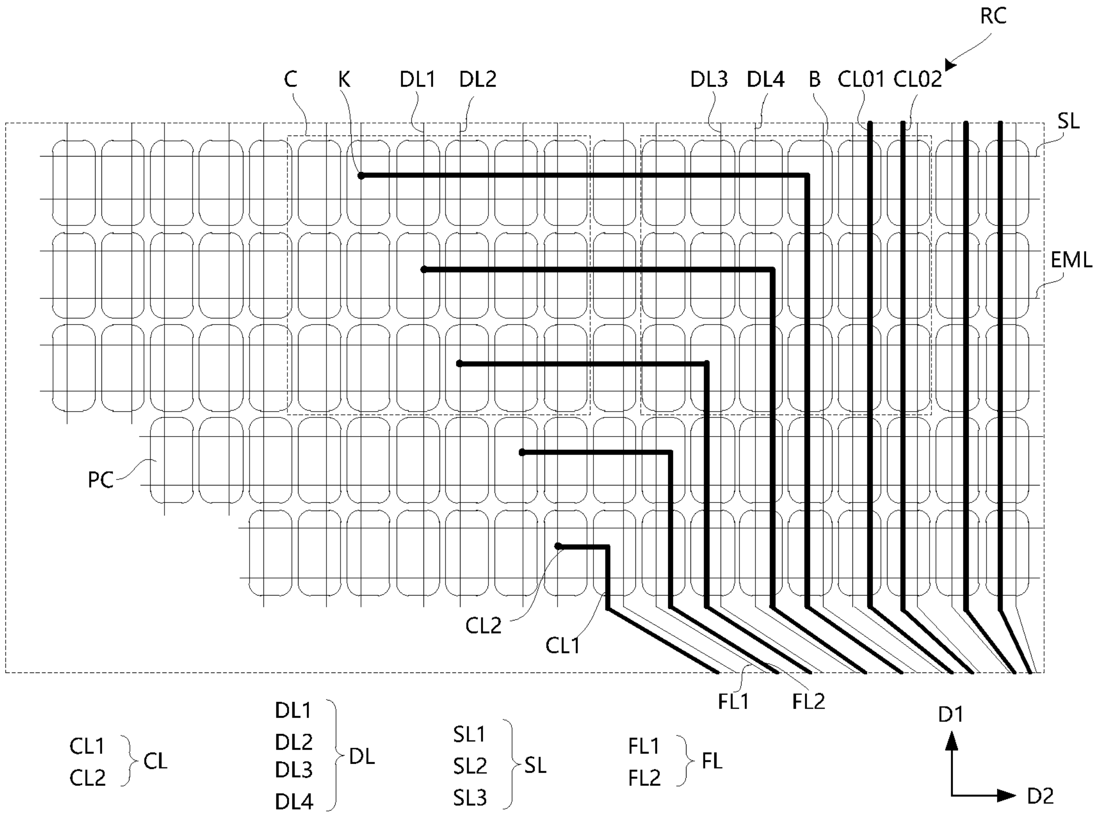
FIG. 3 is an enlarged plan view of a corner area RC shown in FIG. 1 according to an embodiment of the present disclosure.

FIG. 3 is an enlarged plan view of a corner area RC shown in FIG. 1 according to an embodiment of the present disclosure. In some embodiments of the present disclosure, multiple data connecting lines CL are arranged in the display area AA. The signal line in the display area AA can be connected to the pad area BP in the non-display area by the data connecting line CL. Further, as shown by the enlarged view of FIG. 3, the corner area RC may have a line shape that bends several times in the first and second directions, e.g., a step-like shape. The quantities of the pixel circuits PC in the rows in the corner area RC decrease along the first direction. The pixel circuit row adjacent to the bending area BD can have the longest width among the pixel circuit rows arranged in the step-like shape. However, the corner area RC can be recognized as an area with a curved edge, for example the corner area RC has a rounded shape.

The data lines may include a first data line DL1, a second data line DL2, a third data line DL3, and a fourth data line DL4. The first data line DL1 and the second data line DL2 are located in the corner area RC, and are respectively electrically connected to the data connecting lines CL through vias K, so as to achieve the transmission of the data signal from the pad area BP. The third data line DL3 and the fourth data line DL4 are the data lines other than the first data line DL1 and the second data line DL2, that is, the third data line DL3 and the fourth data line DL4 are electrically connected to the pad area BP without the data connecting line CL.

The non-display area NA further includes fan-out lines FL. The fan-out lines FL include a first fan-out line FL1 and a second fan-out line FL2. The first fan-out line FL1 is connected to the data line without the data connecting line CL. For example, the first fan-out line FL1 is directly connected to the third data line DL3 or the fourth data line DL4, so that the data signals outputted by the pad area BP can be transmitted to the corresponding data lines DL3 and DL4. The second fan-out line FL2 is a connecting line that connects the data connecting line CL, so that the data signals outputted by the pad area BP can be transmitted to the corresponding data lines DL1 and DL2. The first fan-out line FL1 and the second fan-out line FL2 can be disposed at different layers. It can be appreciated that the first fan-out line FL1 and the second fan-out line FL2 can be disposed at different layers according to requirements, but the present disclosure is not limited thereto.

The data connecting line CL includes: the first data connecting line CL1 and the second data connecting line CL2. The first data connecting line CL1 is connected to the third data connecting line CL3. The first data connecting line CL1 of the data connecting line CL may be disposed parallel to the data line DL and may partially overlap with or be adjacent to the data line DL. The first data connecting line CL1 of the data connecting line CL is arranged in a pixel column and extends parallel to the data line DL. The second data connecting line CL2 of the data connecting line CL may be parallel to the scan line SL, and may partially overlap with or be adjacent to the scan line SL.

Furthermore, in adjacent pixel columns, the data lines may be disposed adjacent to one another, e.g., the first data line DL1 is adjacent to the second data line DL2, and the third data line DL3 is adjacent to the fourth data line DL4.

In some embodiments of the present disclosure, in adjacent pixel columns, the data connecting lines can be disposed adjacent to one another, e.g., a first data connecting sub-line CL01 is adjacent to a second data connecting sub-line CL02. The first data connecting line CL1 of the data connecting line CL may be a portion of the first data connecting sub-line CL01. For example, the first data connecting sub-line CL01 may include the first data connecting line CL1 and a first data connecting dummy line DCL-1 (to highlight the relationship between data connecting lines, the view is simplified, the first data connecting dummy line is not shown). The first data connecting dummy line DCL-1 is located on the extension line of the first data connecting line CL1. The first data connecting dummy line DCL-1 is disconnected from the first data connecting line CL1 at an inflection point where the first data connecting line CL1 is connected to the second data connecting line CL2. The first data connecting dummy line may be connected to a fixed potential, e.g., any one of a supply voltage signal (PVDD), a cathode voltage signal (PVEE), a reset voltage signal (VREF), etc.

Pairs of adjacent data lines and pairs of adjacent data connecting lines may be arranged alternately along a row direction (a second direction).

A first end of the first data connecting line CL1 of the data connecting line CL is electrically connected to the corresponding first data line DL1 or the second data line DL2 through a via K, and a second end of the first data connecting line CL1 is electrically connected to the corresponding second fan-out line FL2.

A first end of the second fan-out line FL2 is electrically connected to the second end of the first data connecting line CL1, and a second end of the second fan-out line FL2 is electrically connected to the pad area BP. The via K can be located in the display area AA (as shown in FIG. 3) or the non-display area (not shown by FIG. 3). The data connecting line CL may be at a same layer as the second fan-out line FL2, i.e., the second fan-out line FL2 is the extending portion of the data connecting line CL. The second fan-out line FL2 may be located in a different layer from the data connecting line CL. The second fan-out line FL2 and the data connecting line CL may be electrically connected through a via.

A first end of the first fan-out line FL1 is electrically connected to the corresponding first data line DL1 or the second data line DL2, and a second end of the first fan-out line FL1 is electrically connected to the pad area BP. The data connecting line CL can be at a same layer as the first fan-out line FL1, i.e., the first fan-out line FL1 is the extending portion of the data connecting line CL. The first fan-out line FL1 may be located in a different layer from the data connecting line CL. The first fan-out line FL1 and the data connecting line CL may be electrically connected through a via.

By disposing the data connecting line CL in the display area AA, the area occupied by the fan-out line FL in the corner area can be reduced, and the non-display area of the corner area RC can be reduced to achieve a narrow bezel.

It should be noted that the display panel PD may include only the embodiment shown in FIG. 2, only the embodiment shown in FIG. 3, or include both of them, which is not further limited in the present disclosure and can be selected according to actual requirements.

Figure 4:
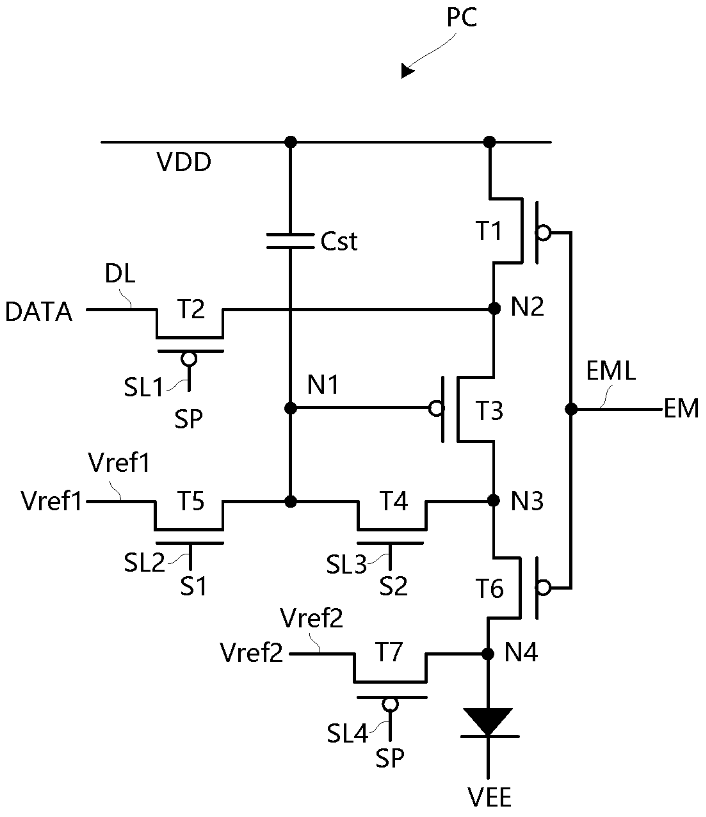
FIG. 4 is a structural schematic diagram showing an equivalent circuit of a pixel circuit according to an embodiment of the present disclosure.

FIG. 4 is a structural schematic diagram showing an equivalent circuit of a pixel circuit according to an embodiment of the present disclosure. Referring to FIG. 4, a pixel circuit PC includes a storage capacitor, a supply voltage (VDD) signal line, a data voltage (DL) signal line, initialization supply voltage (Vref1 and Vref2) signal lines, scan lines SL1, SL2, SL3, SL4, EML, and transistors T1 to T7 connected to multiple signal lines. The initialization power signal lines and/or supply voltage signal lines may be shared by at least one adjacent pixel.

The pixel circuit PC at least includes a drive transistor, a switch transistor, a compensation transistor, an initialization transistor, and a light-emitting control transistor.

In some embodiments of the present disclosure, the first initialization transistor T5, and the compensation transistor T4 may be NMOS, and the other transistors may be PMOS.

In some embodiments of the present disclosure, transistors T1 to T7 are all NMOS or are all PMOS. Alternatively, only one transistor is NMOS or PMOS.

Exemplarily, as shown in FIG. 4, the pixel circuit PC includes a data writing transistor T2, a drive transistor T3, a threshold compensation transistor T4, and a first initialization transistor T5. A first electrode of the threshold compensation transistor T4 is connected to a second electrode of the drive transistor T3, a second electrode of the threshold compensation transistor T4 is connected to a gate of the drive transistor T3, and a gate of the threshold compensation transistor T4 receives a scan signal SL3. A first electrode of the first initialization transistor T5 is connected to the first initialization supply voltage Vref1, a second electrode of the first initialization transistor T5 is connected to the gate of the drive transistor T3, and a gate of the first initialization transistor T5 receives a scan signal SL2. A first electrode of the data writing transistor T2 is connected to a data voltage signal line, a second electrode of the data writing transistor T2 is connected to the first electrode of the drive transistor T3, and a gate of the data writing transistor T2 receives a scan signal SL1. The pixel circuit PC further includes a second initialization transistor T7, a storage capacitor Cst, and light-emitting control transistors T1 and T6. A first electrode of the second initialization transistor T7 is connected to the second initialization supply voltage Vref2, a second electrode of the second initialization transistor T7 is connected to a first electrode of the light-emitting element, and a gate of the second initialization transistor T7 can receive a scan signal SL4 to achieve initialization of the light-emitting element. A first electrode of the storage capacitor Cst is connected to the supply voltage signal line VDD, and a second electrode of the storage capacitor Cst is connected to the gate of the drive transistor T3. A first electrode of the first light-emitting control transistor T1 is connected to the supply voltage signal line VDD, and a second electrode of the first light-emitting control transistor T1 is connected to the first electrode of the drive transistor T3. A first electrode of the second light-emitting control transistor T6 is connected to the second electrode of the drive transistor T3, and a second electrode of the second light-emitting control transistor T6 is connected to the light-emitting element. The second electrode of the light-emitting element can be connected to a voltage end to receive VSS.

In some embodiments of the present disclosure, at least one TFT of the transistors T1 to T7 may include an oxide semiconductor layer, and other transistors of the transistors T1 to T7 may include a silicon semiconductor layer.

Since the oxide semiconductor has characteristics of high carrier mobility and low leakage current, the first initialization transistor T5 and/or the threshold compensation transistor T4 are arranged to include the oxide semiconductor layer, thereby preventing leakage current to the gate of the drive transistor T3 and reducing power consumption.

In some embodiments of the present disclosure, the scan signal SL1 may be the same as the scan signal SL4. That is, the gate of the data writing transistor T2 and the gate of the second initialization transistor T7 are connected to a same scan signal line to receive a same signal, optimizing spatial layout of the pixel circuit.

In some embodiments of the present disclosure, the scan signal SL1 may be different from the scan signal SL4. That is, the gate of the data writing transistor T2 is connected to the scan line SL1, and the gate of the second initialization transistor T7 is connected to the scan line SL4, so that the gate of the data writing transistor T2 and the gate of the second initialization transistor T7 can be independently controlled to increase flexibility of circuit control.

In some embodiments of the present disclosure, the gate of the first light-emitting control transistor T1 and the gate of the second light-emitting control transistor T6 may be connected to a same light-emitting control signal EM to optimize spatial layout of the pixel circuit. The gate of the first light-emitting control transistor T1 and the gate of the second light-emitting control transistor T6 may be connected to different light-emitting control signals to increase flexibility of circuit control.

The first initialization power supply voltage Vref1 and the second initialization supply voltage Vref2 may be different, e.g., Vref1 is greater than Vref2, to improve unintentionally emitting of the light-emitting element. The first and second initialization power supply voltages Vref1 and Vref2 can be adjusted flexibly according to the voltage at which the light-emitting element starts to emit light. For example, Vref1 is lower than Vref2 to improve residual shadow or color trailing. It can be appreciated that, Vref1 can be equal to Vref2, so that the gate of the first initialization transistor T5 and the gate of the second initialization transistor T7 can be connected to a same signal, optimizing the circuit layout.

In some embodiments of the present disclosure, the display panel may operate as follows. In a first period, the first initialization transistor T5 initializes the gate N1 of the drive transistor T3. In a second period, the DATA voltage is supplied through the data writing the transistor T2, and compensates the threshold voltage of the drive transistor T3 through the threshold compensation transistor T4 and the drive transistor T3. In a third period, the first light-emitting control transistor T1, the second light-emitting control transistor T6, and the drive transistor T3 are turned on, the light-emitting element emits light.

In some embodiments of the present disclosure, a structure of the pixel circuit PC may further include structures such as 7T2C, 6T1C, 8T1C, or 9T2C, etc.

Figure 5A:
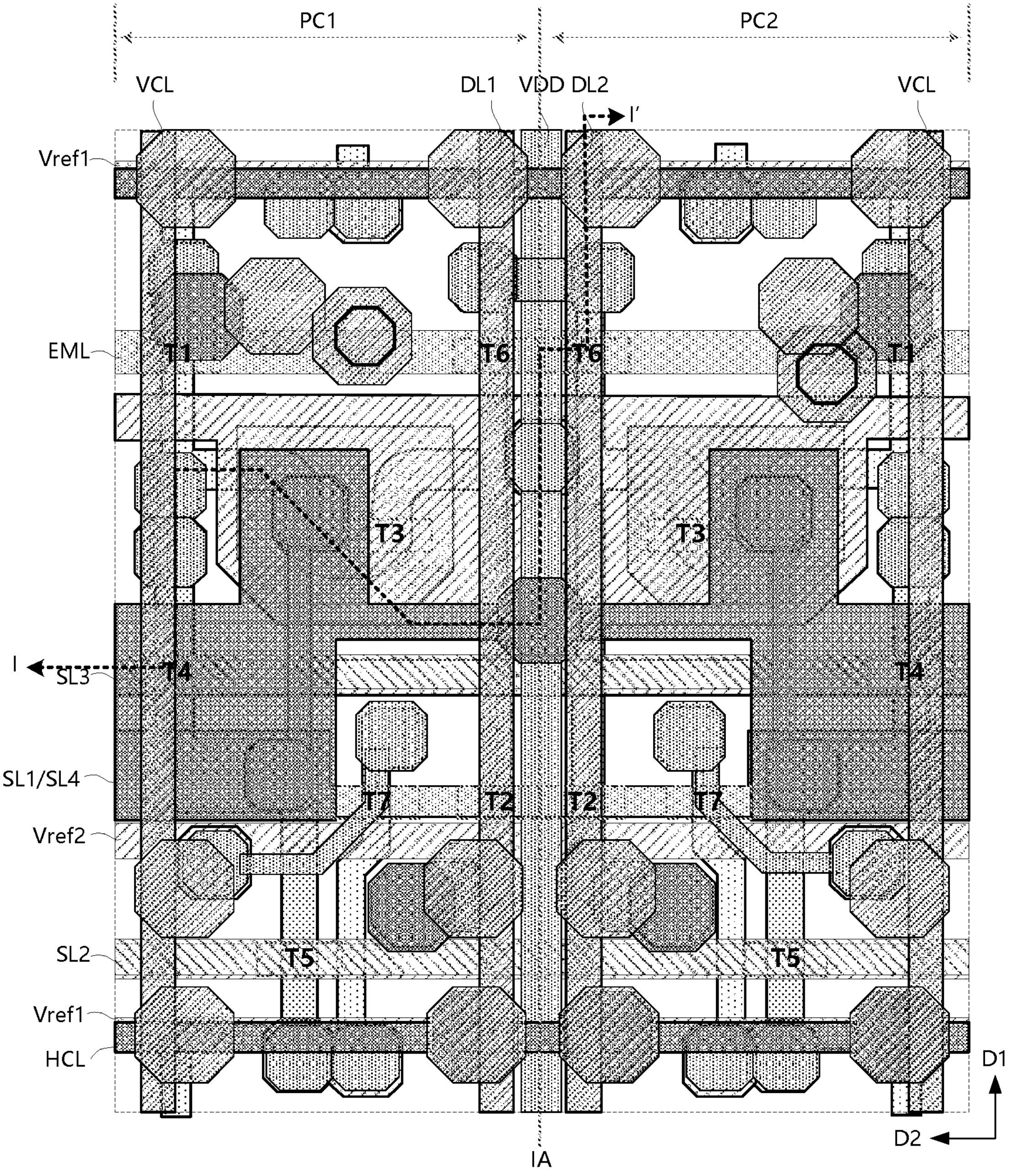
FIG. 5A is a schematic diagram showing a plan layout of thin film transistors and capacitors in a pixel circuit group according to an embodiment of the present disclosure.

FIG. 5A is a schematic diagram showing a plan layout of multiple thin film transistors and capacitors in a pixel circuit group according to an embodiment of the present disclosure.

Referring to FIG. 5A, a pixel circuit PC includes multiple wires extending along a first direction and multiple wires extending along a second direction, where the first direction crosses the second direction. The data line DL and the supply voltage signal line VDD extend in the first direction. The first scan line SL1, the second scan line SL2, the third scan line SL3, the fourth scan line SL4 and the light-emitting control signal line EML extend in the second direction.

The pixel circuit PC further includes transistors T1 to T7 and a storage capacitor Cst. Each of the transistors T1 to T7 can include a semiconductor pattern with a drain area, an active area, a source area, and a channel area between the active area and a drain area, and a gate electrode insulated with the semiconductor layer at a position corresponding to the channel area. In other words, the gate overlaps with the semiconductor pattern at the channel area.

In some embodiments of the present disclosure, each of transistors T4 and T5 includes an oxide semiconductor layer, and each of transistors T1, T2, T3, T6, and T7 includes a silicon semiconductor layer.

Multiple pixel circuits PC can be arranged along the first direction and the second direction in the display area. FIG. 5A shows a pixel circuit group including pixel circuits adjacent to one another. The pixel circuit group includes a first pixel circuit PC1 and a second pixel circuit PC2. The first pixel circuit PC1 may be arranged in a first column, and the second pixel circuit PC2 may be arranged in a second column adjacent to the first column. The first pixel circuit PC1 and the second pixel circuit PC2 are at least partially symmetric with each other with respect to an imaginary axis IA between the first pixel circuit PC1 and the second pixel circuit PC2. For example, the arrangement of the transistors T1 to T7 and the first storage capacitor Cst1 in the first pixel circuit PC1 can be symmetric with the arrangement of the transistors T1 to T7 and the second storage capacitor Cst2 in the second pixel circuit PC2. In some embodiments of the present disclosure, considering the performance difference of the light-emitting pixels in actual situation, part of transistors can be adjusted. For example, the semiconductor pattern in the drive transistor T3 of the first pixel circuit PC1 may be adjusted to be linear, so that the semiconductor of the drive transistor in the first pixel circuit PC1 is designed to be different from the semiconductor (U-shape) of the drive transistor in the second pixel circuit PC2 to meet actual requirements. In addition, for example, it is arranged that the position of the via at the node N1 in the first pixel circuit PC1 is different from the position of the via at the node N1 in the second pixel circuit PC2, thereby maintaining position consistency among different light-emitting pixels.

In the first pixel circuit PC1 and the second pixel circuit PC2, the first initialization supply voltage signal line Vref1, the second initialization supply voltage signal line Vref2, the first scan line SL1, the second scan line SL2, the third scan line SL3, the fourth scan line SL4, and the light-emitting control signal line EML extend in the second direction and are arranged at regular intervals from top to bottom.

The first pixel circuit PC1 and the second pixel circuit PC2 may share the supply voltage signal line VDD. The first data line DL1 and the second data line DL2 extend in the first direction that is parallel to the supply voltage signal line VDD. The first pixel circuit PC1 is connected to the first data line DL1, and the second pixel circuit PC2 is connected to the second data line DL2. The first data line DL1 is arranged at the right side of the first pixel circuit PC1 and the second data line DL2 is arranged at the left side of the second pixel circuit PC2. The first data line DL1 is arranged at the left side of the first pixel circuit PC1, and the second data line DL2 is arranged at the right side of the second pixel circuit PC2. That is, the first data line DL1 and the second data line DL2 are arranged between two adjacent pixel circuits and are adjacent to each other.

The first pixel circuit PC1 and the second pixel circuit PC2 may share the supply voltage signal line VDD. The supply voltage signal line VDD is disposed between the first pixel circuit PC1 and the second pixel circuit PC2. The supply voltage signal line VDD may at least partially overlap with the first data line DL1 and the second data line DL2. The second electrode of the first storage capacitor Cst1 of the first pixel circuit PC1 and the second electrode of the second storage capacitor Cst2 of the second pixel circuit PC2 are connected to each other, and are electrically connected to the supply voltage signal line VDD through a contact hole between the first pixel circuit PC1 and the second pixel circuit PC2. In this way, the supply voltage is transmitted by a network structure with lateral line formed by the first storage capacitor Cst1 and the second storage capacitor Cst2 and longitudinal line formed by the supply voltage signal line VDD, and thus, the supply voltage has a smaller signal delay.

Figure 5B:
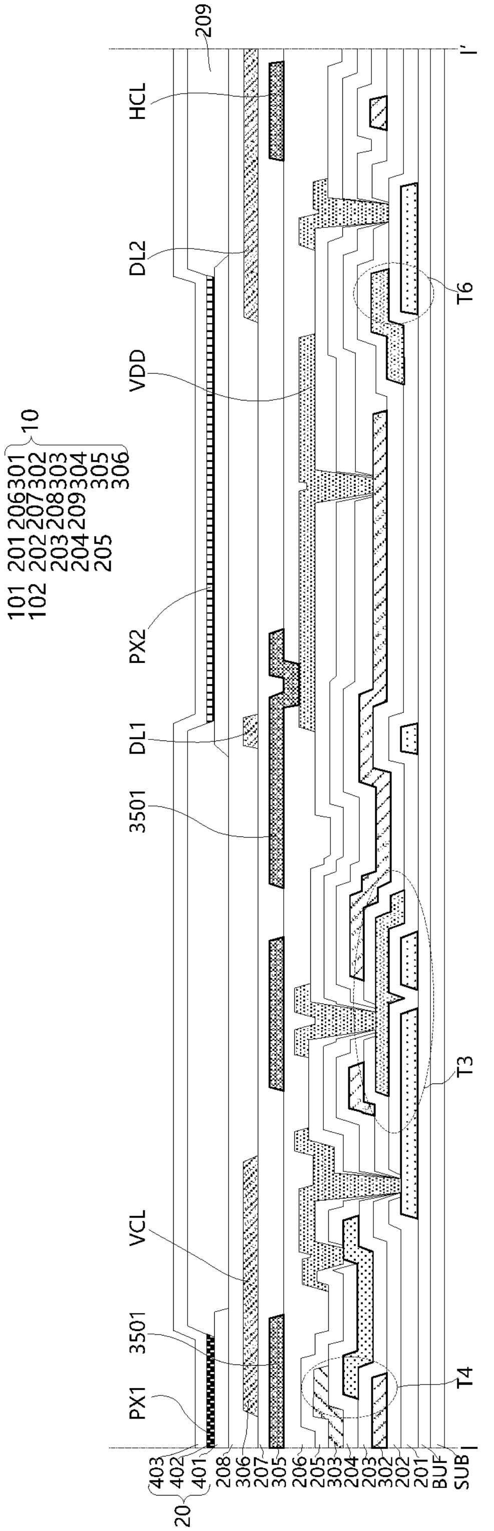
FIG. 5B is a cross-sectional view taken along line I-I' shown in FIG. 5A according to an embodiment of the present disclosure.
Figure 6A:
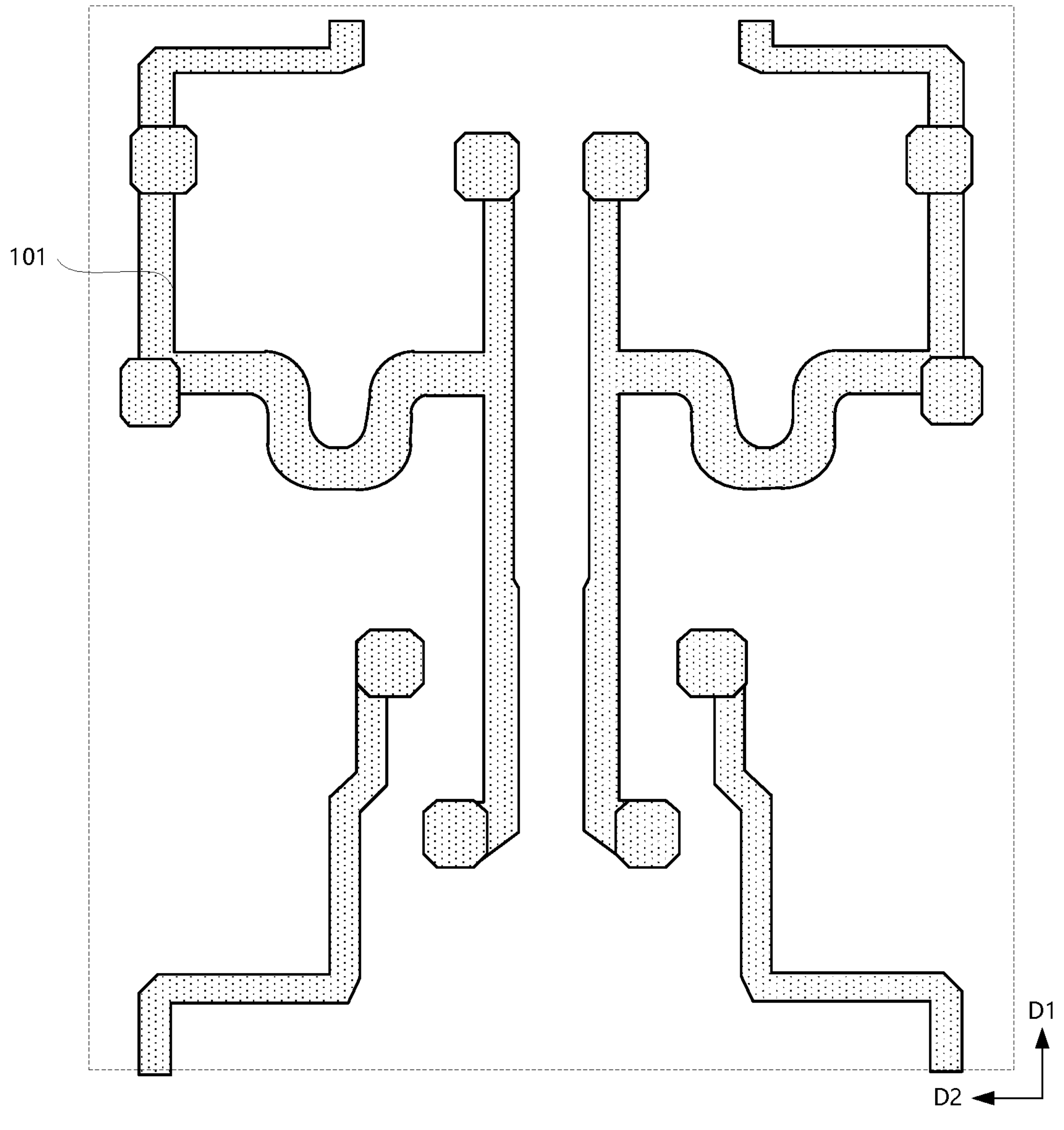
FIG. 6A-6H are plan views of multiple layers in the pixel circuit group shown in FIG. 5A according to an embodiment of the present disclosure, respectively.
Figure 6B:
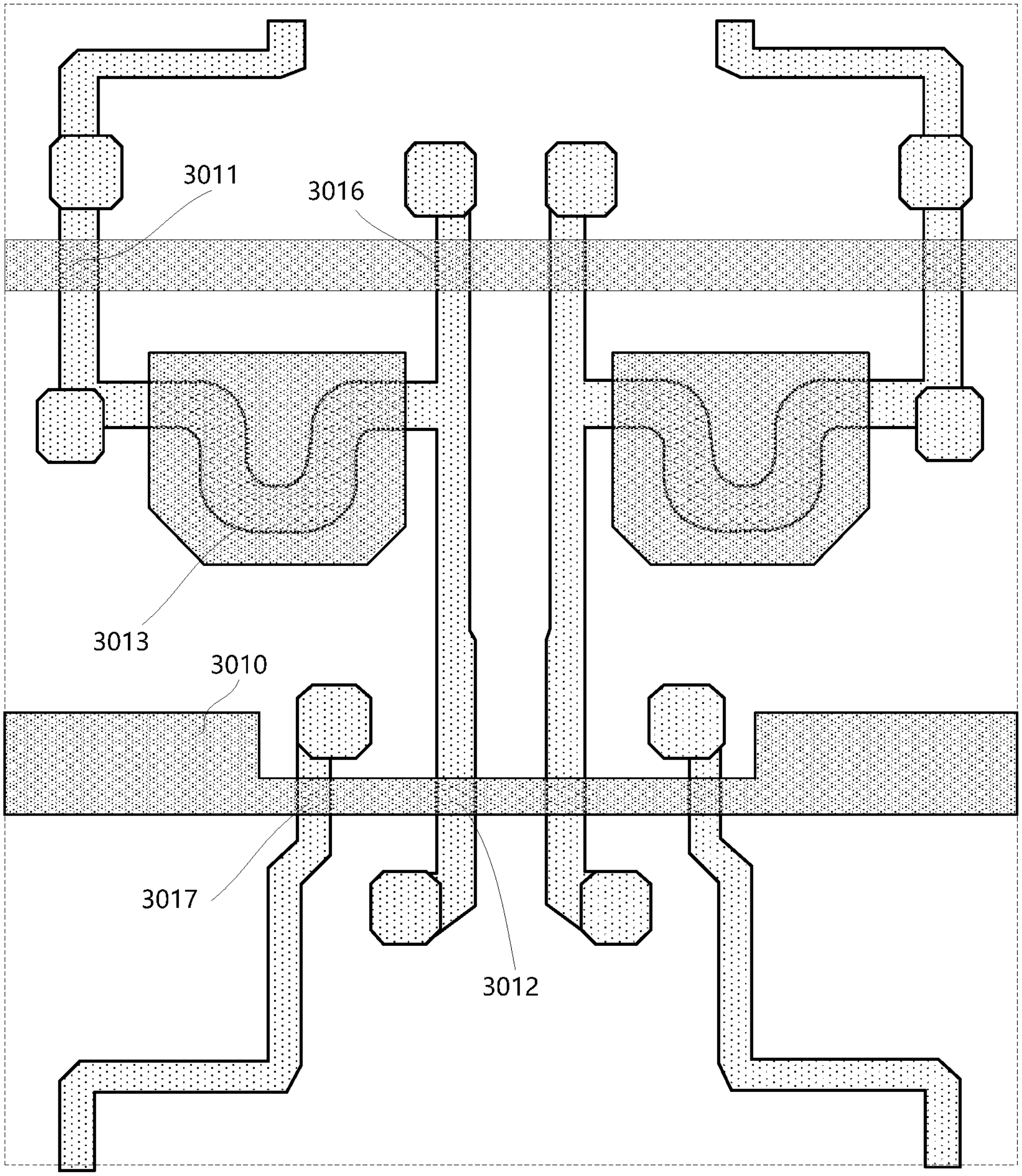
Figure 6C:
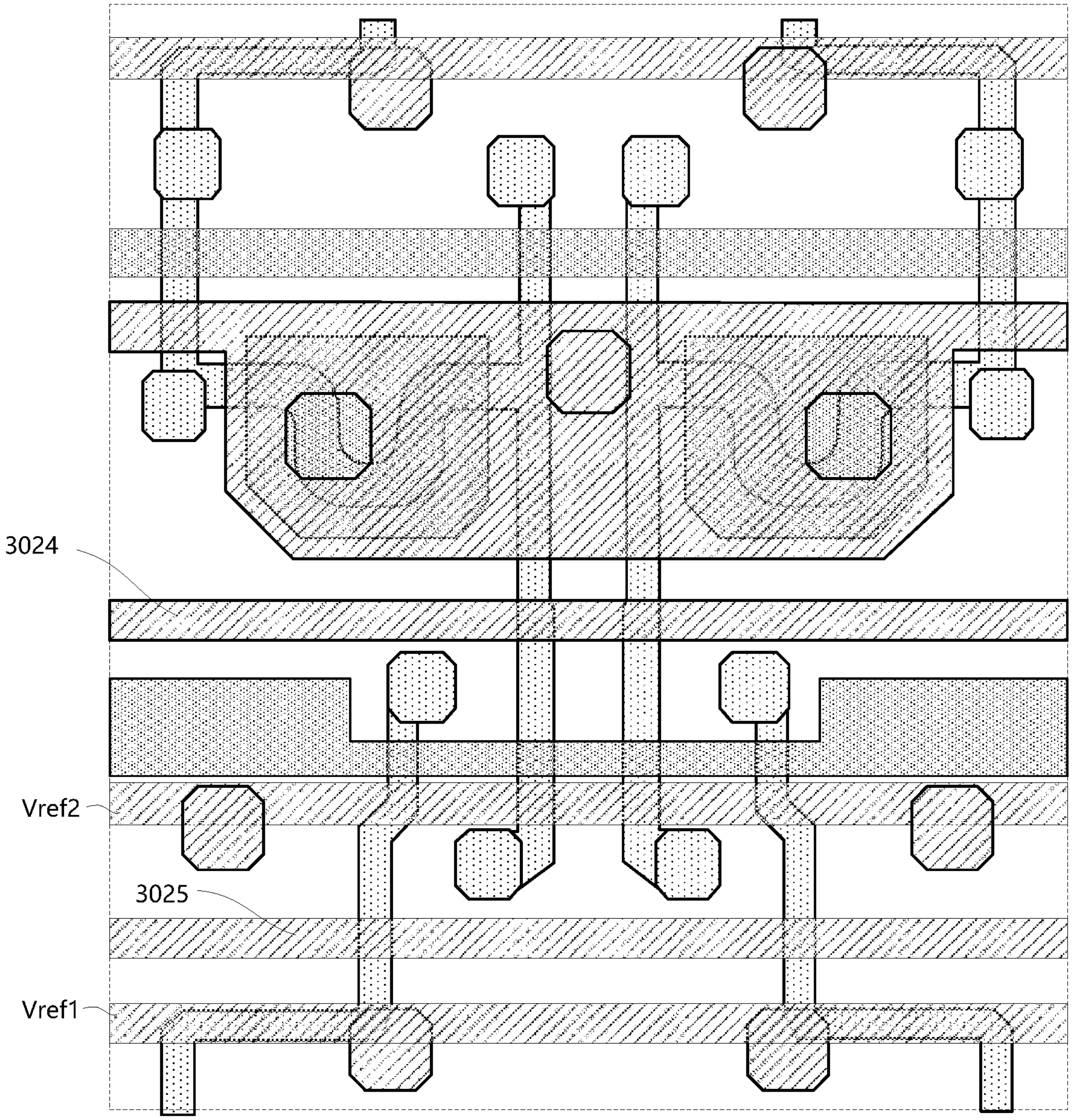
Figure 6D:
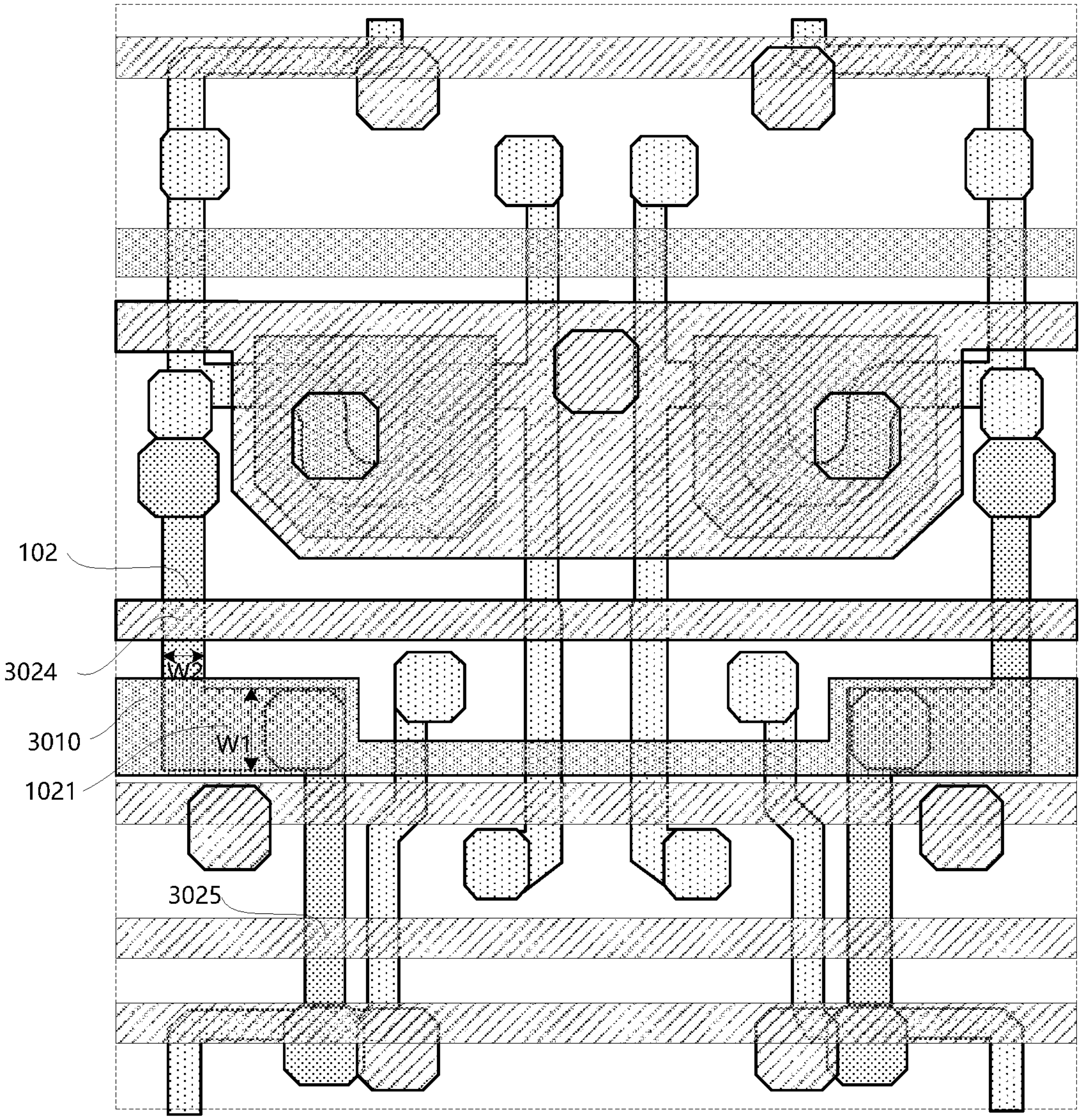
Figure 6E:
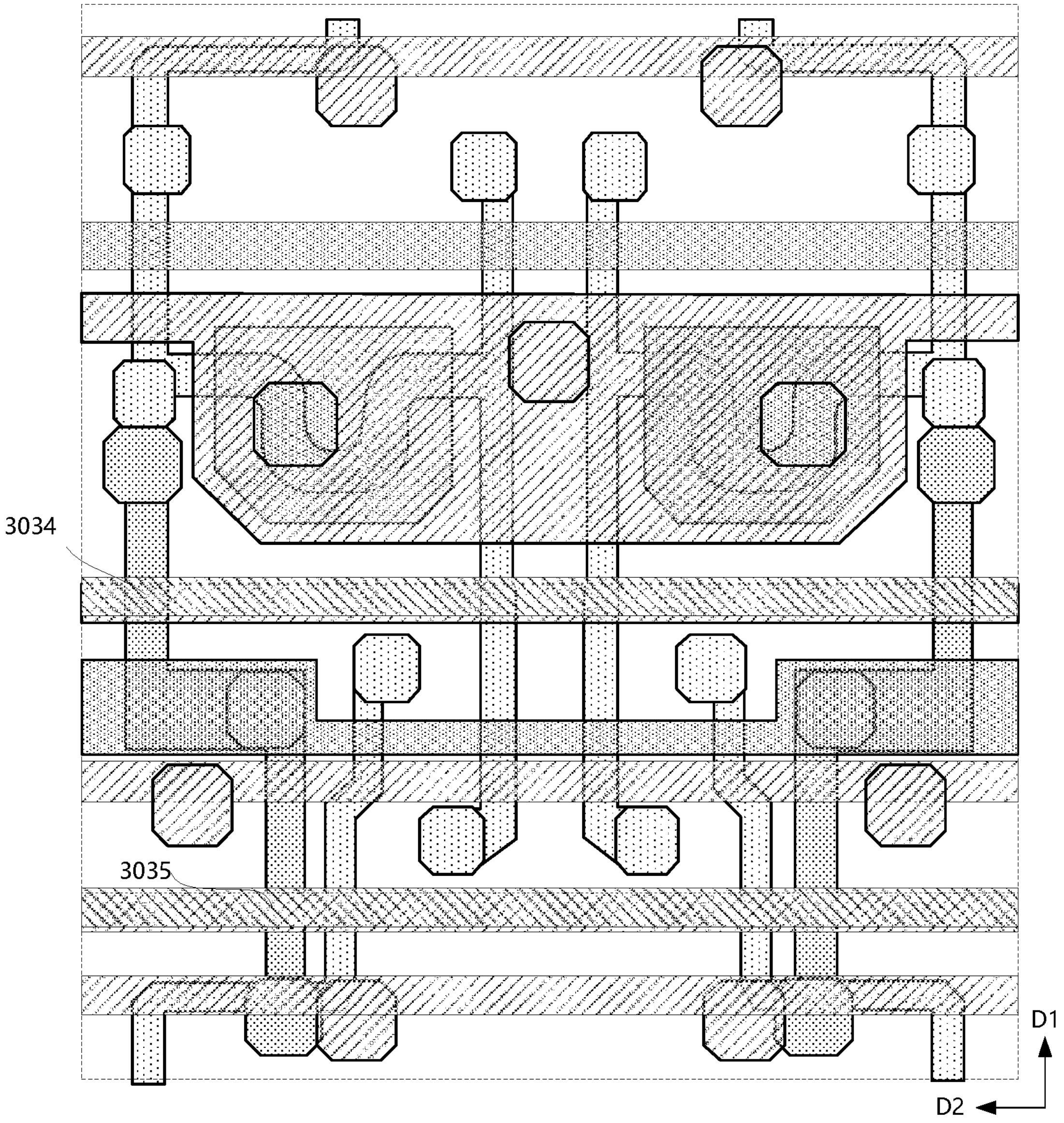
Figure 6F:
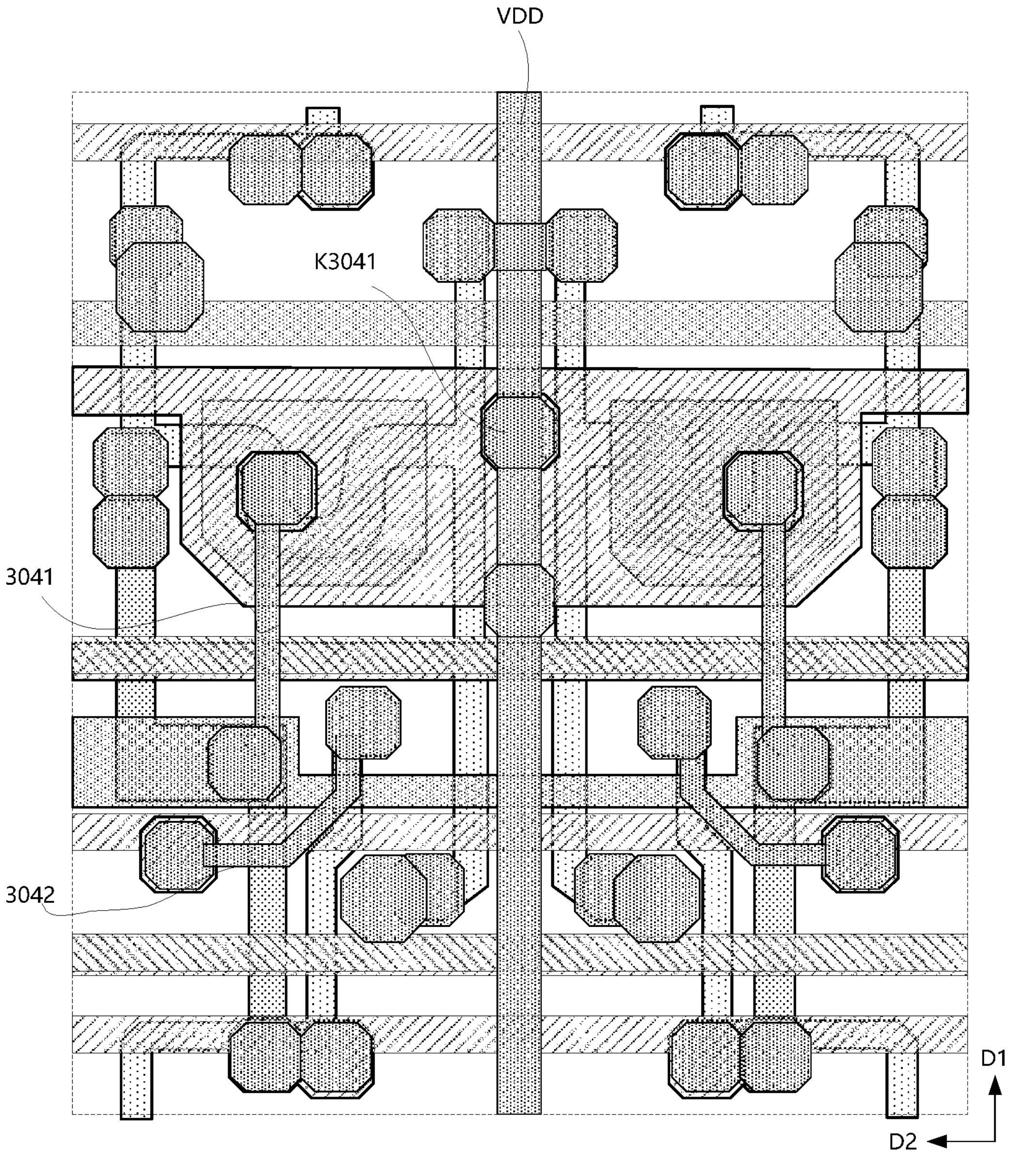
Figure 6G:
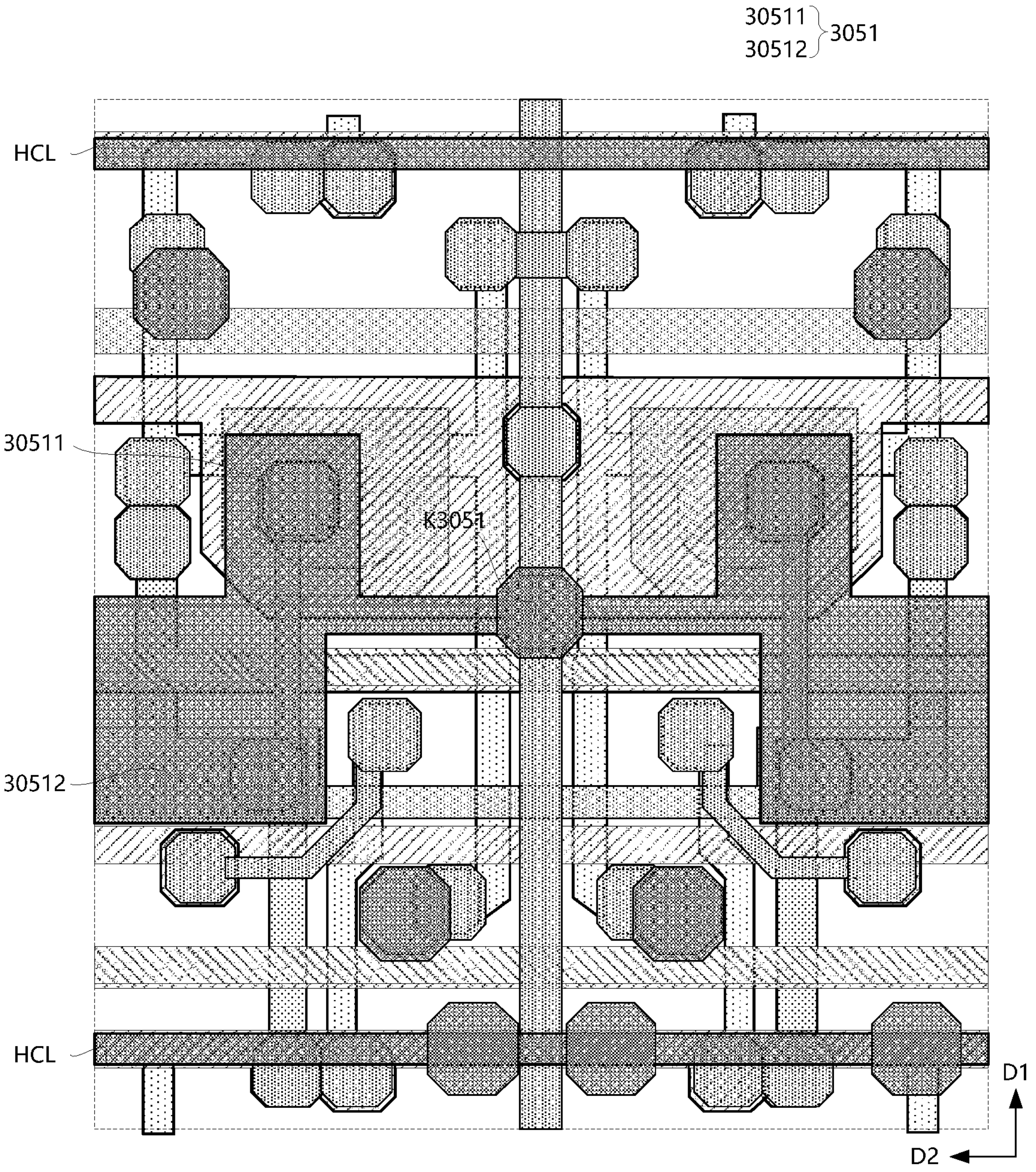
Figure 6H:
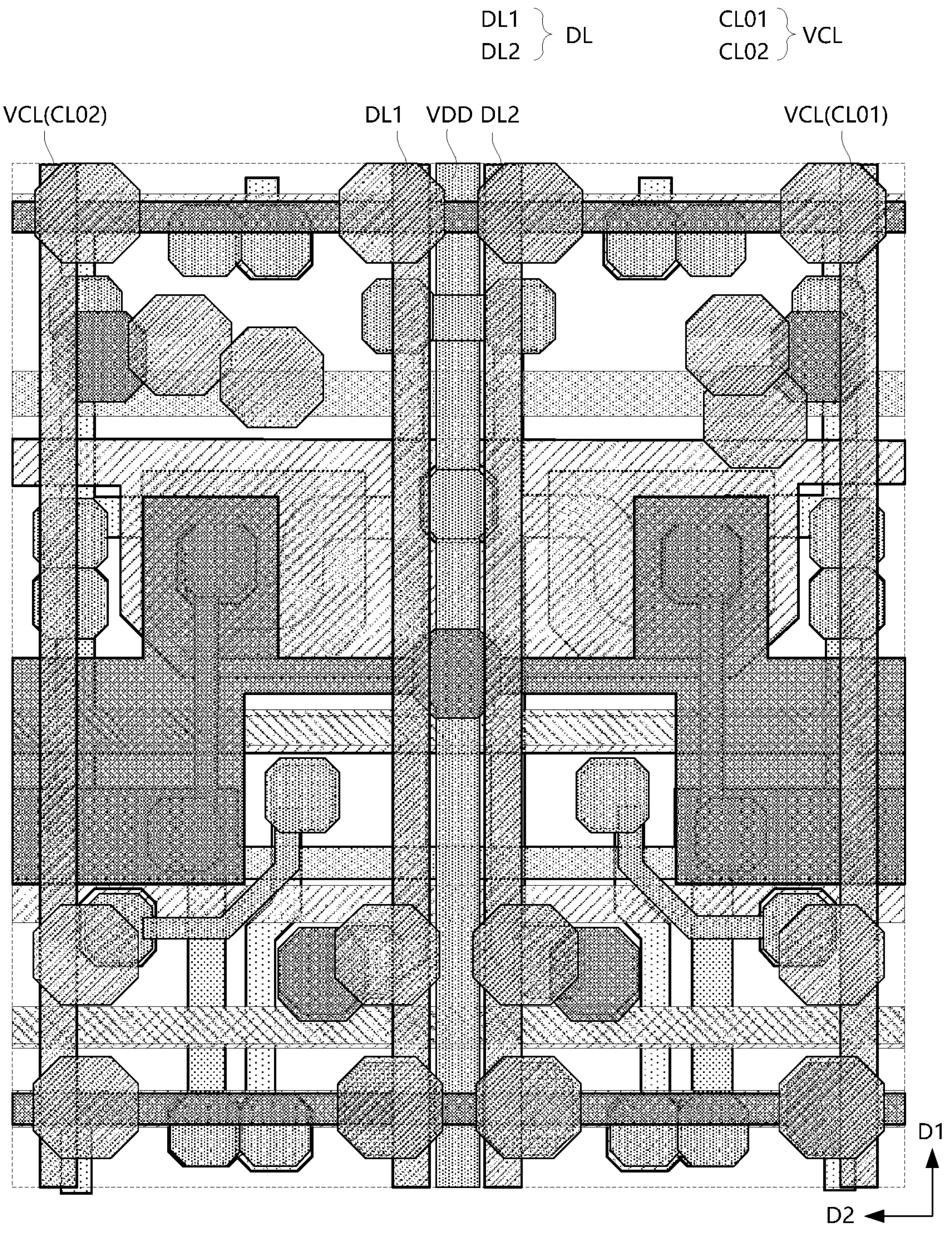

FIG. 6A-6H are plan views of multiple layers in the pixel circuit group shown in FIG. 5A according to an embodiment of the present disclosure. FIG. 5B is a cross-sectional view taken along line I-I' shown in FIG. 5A according to an embodiment of the present disclosure.

The display panel PD includes a substrate SUB, a drive circuit layer and a light-emitting element layer 20. The drive circuit layer 10 is disposed on the substrate SUB, and the light-emitting element layer 20 is disposed at a side of the drive circuit layer 10 away from the substrate SUB.

The drive circuit layer 10 includes a first semiconductor layer 101, a first insulating layer 201, a first conducting layer 301, a second insulating layer 202, a second conducting layer 302, a third insulating layer 203, a second semiconductor layer 102, a fourth insulating layer 204, a third conducting layer 303, a fifth insulating layer 205, a fourth conducting layer 304, a sixth insulating layer 206, a fifth conducting layer 305, a seventh insulating layer 207, a sixth conducting layer 306, an eighth insulating layer 208 and a pixel definition layer 209 that are sequentially stacked.

The first insulating layer 201, the second insulating layer 202, and the fourth insulating layer 204 are gate insulating layers. The third insulating layer 203 and the fifth insulating layer 205 are interlayer insulating layers. The first insulating layer 201, the second insulating layer 202, the third insulating layer 203, the fourth insulating layer 204 and the fifth insulating layer 205 are made of at least one of silicon nitride or silicon oxide.

The sixth insulating layer 206, the seventh insulating layer 207 and the eighth insulating layer 208 are all organic planarization layers. The sixth insulating layer 206, the seventh insulating layer 207 and the eighth insulating layer 208 are made of at least one of polyimide or polyacrylate.

The first semiconductor layer 101 is a low temperature poly silicon semiconductor layer. The first semiconductor layer 101 includes a third active pattern 1013 of the drive transistor T3, a second active pattern 1012 of the data writing transistor T2, a first active pattern 1011 of the first light-emitting control transistor T1, a sixth active pattern 1016 of the second light-emitting control transistor T6, and a seventh active pattern 1017 of the second initialization transistor T7. The first semiconductor layer further includes the active pattern of the thin film transistor in the pixel circuit.

The second semiconductor layer 102 is a metal oxide semiconductor layer. The second semiconductor layer 102 includes a fourth active pattern 1014 of the threshold compensation transistor T4, and a fifth active pattern 1015 of the first initialization transistor T5.

The second semiconductor 102 may be disposed as a polyline and include a first transition portion 1021. A width W1 of the first transition portion is larger than a width W2 of other portions of the oxide semiconductor.

The first conducting layer 301, the second conducting layer 302, the third conducting layer 303, the fourth conducting layer 304, the fifth conducting layer 305 and the sixth conducting layer 306 are made of a material selected from at least one of molybdenum, aluminum, titanium, copper and silver.

The first conducting layer 301 includes a third gate 3013 of the drive transistor T3, a second gate 3012 of the data writing transistor T2, a first gate 3011 of the first light-emitting control transistor T1, a sixth gate 3016 of the second light-emitting control transistor T6, and a seventh gate 3017 of the second initialization transistor T7. The first conducting layer 301 further includes a gate trace of the thin film transistor in the pixel circuit. The third gate 3013 of the drive transistor T3 reuses a first plate of the storage capacitor Cst.

The scan lines SL1, SL4 located in the first conducting layer 301 do not extend in the second direction with a same width. The first conducting layer 301 further includes a scan extending portion 3010. The scan line and the scan extending portion 3010 may at least partially overlap with the oxide semiconductor layer, e.g., at least partially overlaps with the first transition portion in order to form capacitance, so that the capacitance between the node N1 and the scan line is increased, and the jump of the signal on the scan line signal causes the potential of the node N1 to rise, thereby reducing dark state voltage.

The second conducting layer 302 includes a second plate of the storage capacitor, a fourth lower gate 3024 of the threshold compensation transistor T4, and a fifth lower gate 3025 of the first initialization transistor T5. The second conducting layer 302 further includes initialization supply voltage signal lines Vref1 and Vref2.

The capacitance between the second conducting layer and the data line DL is small, so that the initialization supply voltage signal lines Vref1 and Vref2 arranged in the second conducting layer have less influence on the data line DL, thereby reducing the load of the data line DL.

The third conducting layer 303 includes a fourth upper gate 3034 of the threshold compensation transistor T4 and a fifth upper gate 3035 of the first initialization transistor T5.

The fourth conducting layer 304 includes a node N1 (also referred to as the first node) connecting line segment 3041, a second initialization connecting line segment 3042 and the supply voltage signal line VDD. The supply voltage signal line VDD is connected to the second plate of the storage capacitor Cst through a via K3041, so that the supply voltage is transmitted in a grid structure.

The fifth conducting layer 305 includes a second-type data connecting line HCL extending in the second direction and a shielding portion 3051. The shielding portion 3051 as a whole extends in the second direction and is connected to the fixed potential. The shielding portion 3051 is connected to the supply voltage signal line VDD through a via K3051, so that the supply voltage is further transmitted in a grid structure. The shielding portion 3051 includes a first convex portion 30511 and a second convex portion 30512 both protruding along the first direction. The first convex portion 30511 extends toward the drive transistor T3, and overlaps with a part of the channel and a part of the gate of the drive transistor T3 and a part of the first node (the node N1) connecting line segment 3041, so that the crosstalk of the node N1 can be improved, thereby improving the potential stability of the node N1. The second convex portion 30512 extends by away from the drive transistor T3, overlaps with at least a part of the second semiconductor layer, e.g., it overlaps with the channel of the threshold compensation transistor T4 and a part of the oxide semiconductor, so that the effect of light illumination and other factors on the semiconductor is reduced, thereby preventing threshold drift.

The second-type data connecting line HCL is disposed between the scan line connected to a fifth gate of the first initialization transistor T5 and the light-emitting control signal line EML.

In some embodiments of the present disclosure, the second-type data connecting line HCL at least partially overlaps with the fixed voltage signal line, e.g., it at least partially overlaps with the first initialization supply voltage signal line Vref1. Since the first initialization supply voltage signal line Vref1 is a fixed potential, so that the signal of the second-type data connecting line HCL can be more stable.

Furthermore, a width of the second-type data connecting line HCL is smaller than a width of the first initialization signal line Vref1. In this way, it can be guaranteed that the second-type data connecting line HCL completely overlaps with the first initialization supply voltage signal line Vref1, that is, an orthographic projection of the second-type data connecting line HCL is within an orthographic projection of the first initialization supply voltage signal line Vref1.

In some embodiments of the present disclosure, the shielding portion 3051 at least partially overlaps with at least one scan line. For example, the shielding portion 3051 at least partially overlaps with the scan lines (including the scan line where the fourth upper gate is located and the scan line where the fourth lower gate is located) connected to the fourth gates of the fourth transistor T4. In this way, the shielding portion 3051 overlaps with other metals as much as possible without occupying other space, thereby ensuring the transmittance.

The sixth conducting layer 306 includes data lines DL and first-type data connecting lines VCL, that is, the data lines DL and the first-type data connecting lines VCL are disposed in a same layer to optimize wire arrangement of the pixel circuit. The second-type data connecting line and the data line DL are substantially parallel to each other along the first direction. The first pixel circuit PC1 is connected to the first data line DL1, and the second pixel circuit PC2 is connected to the second data line DL2. The first data line DL1 is arranged on the right side of the first pixel circuit PC1, and the second data line DL2 is arranged on the left side of the second pixel circuit PC2. The first data line DL1 is arranged on the left side of the first pixel circuit PC1, and the second data line DL2 is arranged on the right side of the second pixel circuit PC2. That is, the first data line DL1 and the second data line DL2 are arranged between two adjacent pixel circuits and are adjacent to each other. The first-type data connecting line VCL includes a first data connecting line CL01 and a second data connecting line CL02. The first data connecting line CL01 is configured in the area of the first pixel circuit PC1, and the second data connecting line CL02 is configured in the area of the second pixel circuit PC2. The first data connecting line CL01 is located on a side away from the imaginary axis between the first pixel circuit PC1 and the second pixel circuit PC2. The second data connecting line CL02 is located on a side away from the imaginary axis between the first pixel circuit PC1 and the second pixel circuit PC2. The first data connecting line CL01 is arranged on the left side of the first pixel circuit PC1, and the second data connecting line CL02 is arranged on the right side of the second pixel circuit PC2. Alternatively, the first data connecting line CL01 is arranged on the right side of the first pixel circuit PC1, and the second data connecting line CL02 is arranged on the left side of the second pixel circuit PC2. The first data connecting line CL01 at least partially overlaps with the silicon semiconductor and the oxide semiconductor, so that the effect of light illumination and other factors on the semiconductor is reduced, thereby preventing threshold drift. In some embodiments of the present disclosure, the first data connecting line CL01 overlaps with the shielding portion 3051 and/or the second convex portion 30512 to stabilize the signal transmitting through the first data connecting line CL01, preventing crosstalk with adjacent data signals. The second data connecting line CL02 at least partially overlaps with the silicon semiconductor and the oxide semiconductor, so that the effect of light illumination and other factors on the semiconductor is reduced, thereby preventing threshold drift. In some embodiments of the present disclosure, the second data connecting line CL02 overlaps with the shielding portion 3051 and/or the second convex portion 30512 to stabilize the signals transmitting through the second data connecting line CL02, preventing crosstalk with adjacent data signals.

In some embodiments of the present disclosure, the data lines DL are located in one layer, while the first-type data connecting line HCL and the second-type data connecting line are located in a same layer, but the present disclosure is not limited thereto.

Figure 7A:
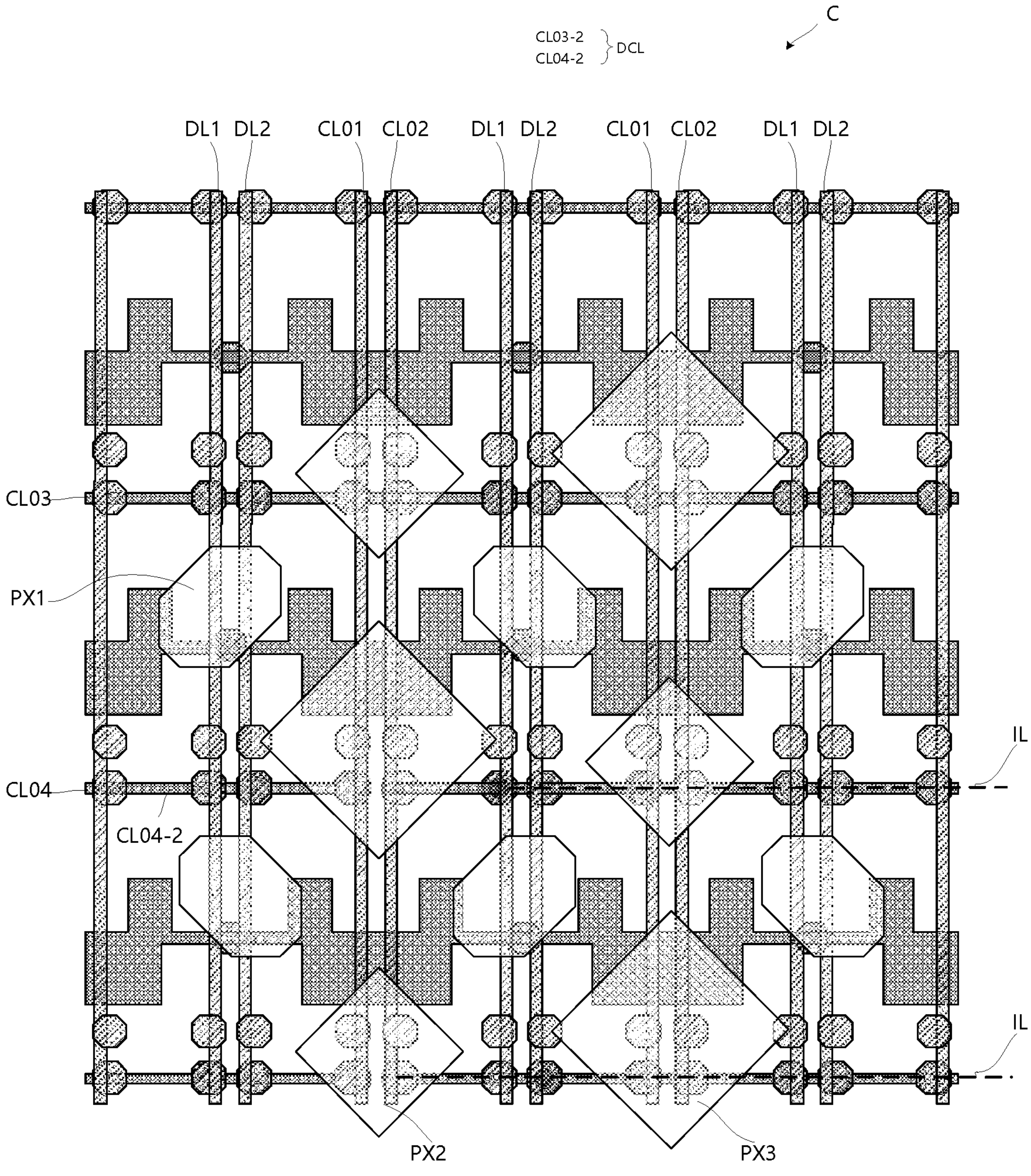
FIG. 7A is a structural schematic diagram of layers in an area C shown in FIG. 3 according to an embodiment of the present disclosure.
Figure 7B:
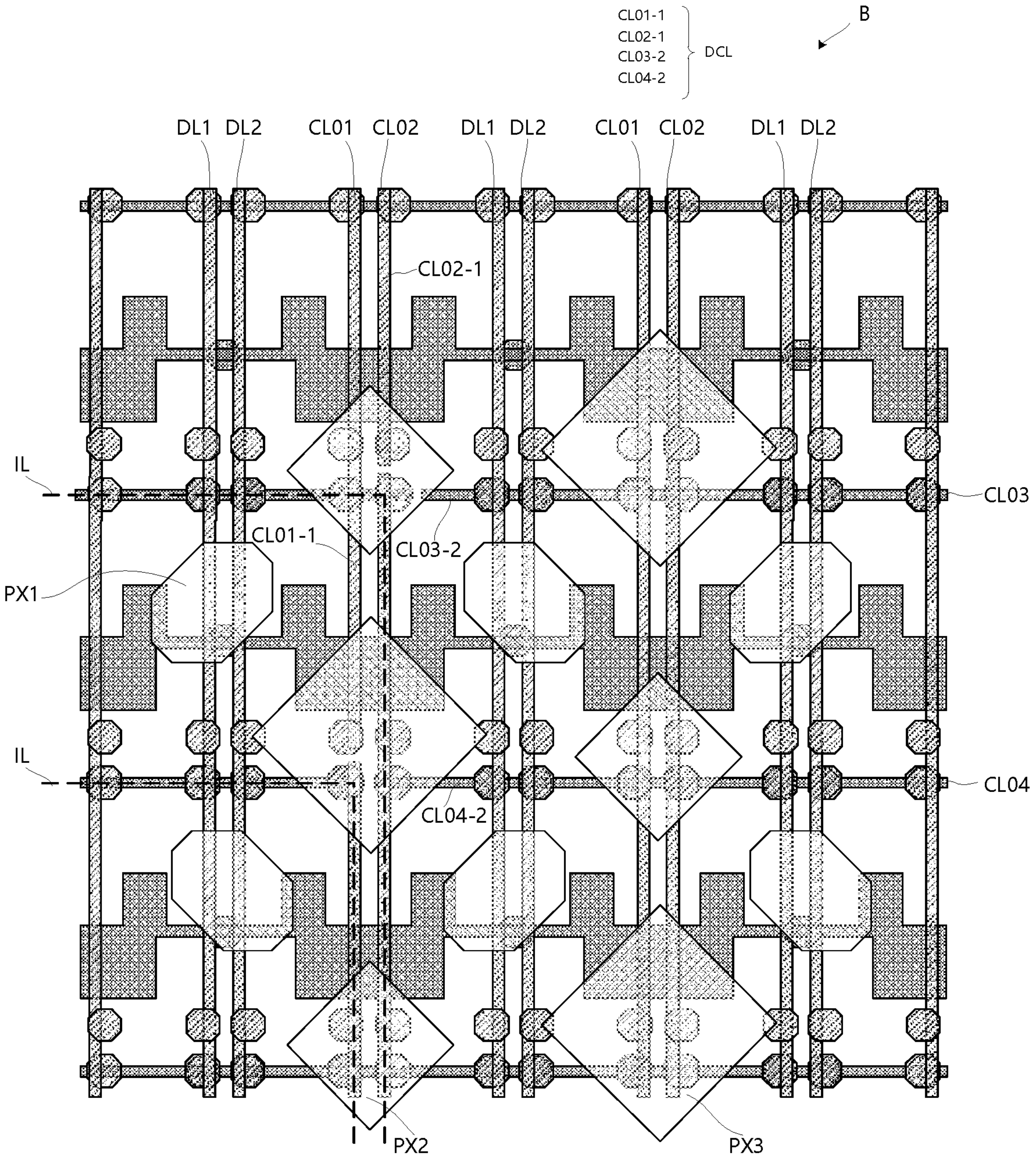
FIG. 7B is a structural schematic diagram of layers in an area B shown in FIG. 3 according to an embodiment of the present disclosure.

FIG. 7A is a structural schematic diagram of layers in an area C shown in FIG. 3 according to an embodiment of the present disclosure, and FIG. 7B is a structural schematic diagram of layers in an area B shown in FIG. 3 according to an embodiment of the present disclosure. As shown in FIG. 5A and FIG. 6A to 6H, pixel circuit groups are arranged in the first direction and in the second direction. The first data connecting line CL01 and the second data connecting line CL02 are arranged between adjacent pixel circuit groups and are adjacent to each other. For example, the first data connecting line CL01 and the second data connecting line CL02 are adjacent to each other without any other signal line located between the first data connecting line CL01 and the second data connecting line CL02. In other words, the first data connecting line CL01 and the second data connecting line CL02 are arranged between adjacent data line groups and are adjacent to each other. The first data line DL1 and the second data line DL2 may be considered as a first trace group, the first data connecting line CL01 and the second data connecting line CL02 may be considered as a second trace group, and the first trace group and the second trace group are arranged alternately.

Figure 8:
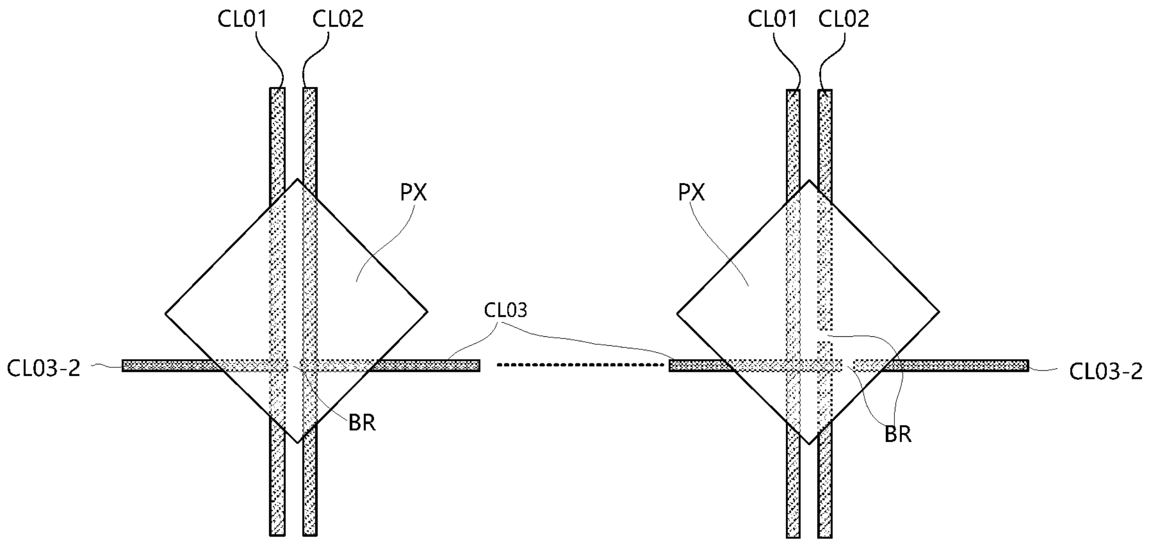
FIG. 8 is a partial enlarged view of a layer structure according to an embodiment of the present disclosure.

FIG. 8 is a partial enlarged view of a layer structure according to an embodiment of the present disclosure. FIG. 7A and FIG. 7B further show the embodiment of the data connecting line CL and a relative position relation between the data connecting line CL and the light-emitting element. As shown in FIG. 7A and FIG. 7B, the signal of the pad area BP is transmitted to the corresponding data connecting line, such as the second data connecting line CL02. The second data connecting line CL02 includes a second data connecting dummy line CL02-1. Each of the second data connecting dummy line CL02-1 and the second data connecting line CL02 includes a breaking BR. The second-type data connecting line HCL includes a third data connecting line CL03. The third data connecting line CL03 includes a third data connecting dummy line CL03-2. Each of the third data connecting line CL03 and the third data connecting dummy line CL03-2 includes a breaking BR. The second data connecting line CL02 and the third data connecting line CL03 are electrically connected. As shown in FIG. 7B, the path IL denoted by the dotted line (imaginary line) forms a conductive path (the data connecting line that forms the conductive path can further be referred to as effective data connecting line). One end of the third data connecting line CL03 is connected to the data line, e.g., the second data line DL2, thereby achieving transmission of the data signal. The data connecting dummy line DCL is connected to the fixed potential.

In some embodiments of the present disclosure, the data lines are adjacent to one another, and/or the data connecting lines are adjacent to one another, so that the interference between different types of signal lines can be improved. In addition, the signal lines adjacent to each other transmit a same type signal, e.g., the signal lines adjacent to each other are data lines, or the signal lines adjacent to each other are data connecting lines. There are small differences in manufacturing process of the signal lines, such as line width and film thickness. Due to similarity of functions, when the light-emitting element overlaps with signal lines of the same type, the flatness of the anode can be further improved, thereby weakening color shift. In addition, the data lines are adjacent to each other and/or the data connecting lines are adjacent to each other, so that the number of data lines under a specific light-emitting element can be flexibly adjusted to improve the coupling of data line to the anode due to signal jump, thereby improving light-emitting effect. For example, according to the requirements, the data lines may be selectively placed only below the anodes of the green light-emitting elements, or placed only below the anodes of the red/blue light-emitting elements, i.e., the anode of the light-emitting element is disposed with only one data line arranged below the anode, and the other data line is connected to a fixed potential, thereby increasing adjustment flexibility of display effect of the panel.

The pixel definition layer 209 includes pixel openings. The pixel definition layer 209 is an organic insulating layer.

The light-emitting element layer 20 includes an anode 401, an organic light-emitting layer 402 and a cathode 403. The organic light-emitting layer 402 is located between the anode 401 and the cathode 403. The anode 401 is disposed corresponding to the pixel opening, and the pixel opening exposes a portion of the anode 401. The organic light-emitting layer 402 is located in the pixel opening.

The light-emitting element layer 20 includes multiple light-emitting elements 20 such as a first light-emitting element PX1, a second light-emitting element PX2, and a third light-emitting element PX3. Accordingly, the anode 401 corresponding to the first light-emitting element PX1 is labeled as 4011, the anode 401 corresponding to the second light-emitting element PX2 is labeled as 4012, and the anode 401 corresponding to the third light-emitting element PX3 is labeled as 4013. Multiple light-emitting elements may be arranged in a pattern such as a diamond arrangement, a π arrangement and the like. A diamond-like arrangement is taken as an example in the present disclosure, which is not limited in the present disclosure.

Referring to FIG. 8, the breaking BR disconnecting the data connecting line from the data connecting dummy line DCL is located below the anode 401 of the light-emitting element, that is, the anode 401 of the light-emitting element 20 overlaps with the breaking BR, which can eliminate visibility of the breaking BR and improve the display effect of the display panel.

Figure 9:
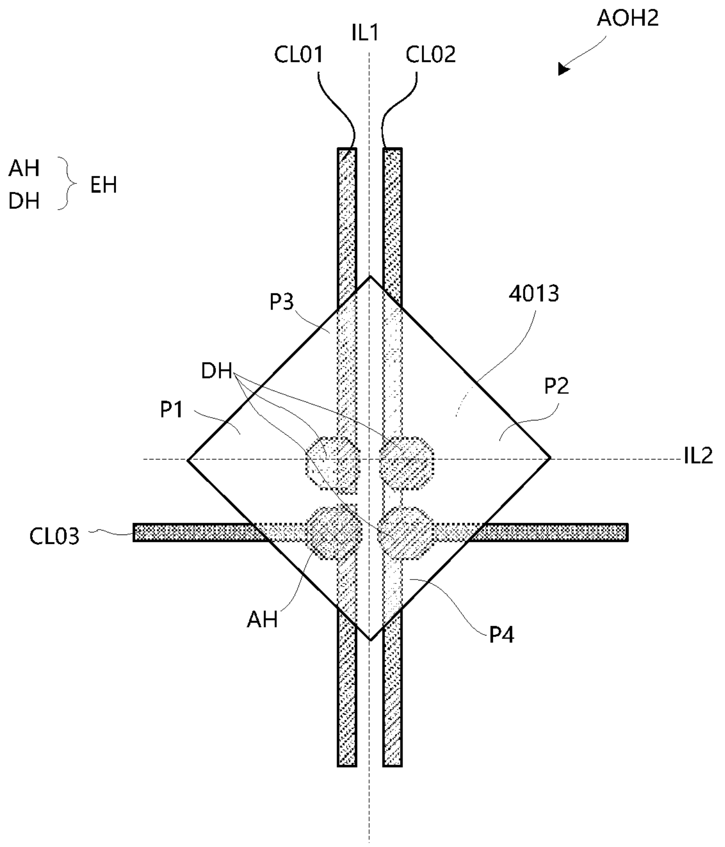
FIG. 9 is a partial enlarged view of a layer structure according to another embodiment of the present disclosure.

FIG. 9 is a partial enlarged view of a layer structure according to another embodiment of the present disclosure.

In some embodiments of the present disclosure, combining with FIG. 7A and FIG. 7B, FIG. 9 shows an arrangement of overlapping of a third anode 4013 of the light-emitting element with the connecting structure EH. A first imaginary line IL1 and a second imaginary line IL2 are imaginary symmetry axes of the third anode 4013. The connecting structure includes an effective connecting structure AH between the first data connecting line CL01 and the third data connecting line CL03 and/or a dummy connecting structure DH. The dummy connecting structure is arranged to be a layer structure/metal pad in the corresponding position according to the actual requirements, but in fact is not connected to adjacent signal lines. In a position shown in FIG. 9, there is actually only one effective connecting structure AH. Due to a small distance between the connecting structure and the anode 401, the connecting structure will make a portion of the anode corresponding to the connecting structure higher than other portions of the anode. In the plan view, a protrusion caused by connecting structure may be observed, which makes the anode uneven and further results in a color shift problem. The anode 401 is divided into a first portion P1 and a second portion P2 by the first imaginary line ILL The number of the connecting structure EH overlapped with the first portion P1 is the same as the number of the connecting structure EH overlapped with the second portion P2, so that disposing the dummy connecting structure DH in a position symmetric with the effective connecting structure AH can improve the partial protrusion of the anode, thereby further weakening color shift. The number of the dummy connecting structures here is not limited, which may be one or more.

The third anode 4013 is divided into a third portion P3 and a fourth portion P4 by the second imaginary line IL2. The connecting structures in the third portion P3 that has a same number of connecting structure as in the four portion P4 overlaps with the second imaginary line IL2. That is, a sum of area of the connecting structures EH disposed in the fourth portion takes up a larger proportion, that is, relative to the second imaginary line IL2, the connecting structure disposed is closer to the fourth portion, and disposing the same number of connecting structure at the second imaginary line IL2 as in the fourth portion can maintain the consistency with the protrusion area of other anodes 401, further improving color shift.

Figure 10:
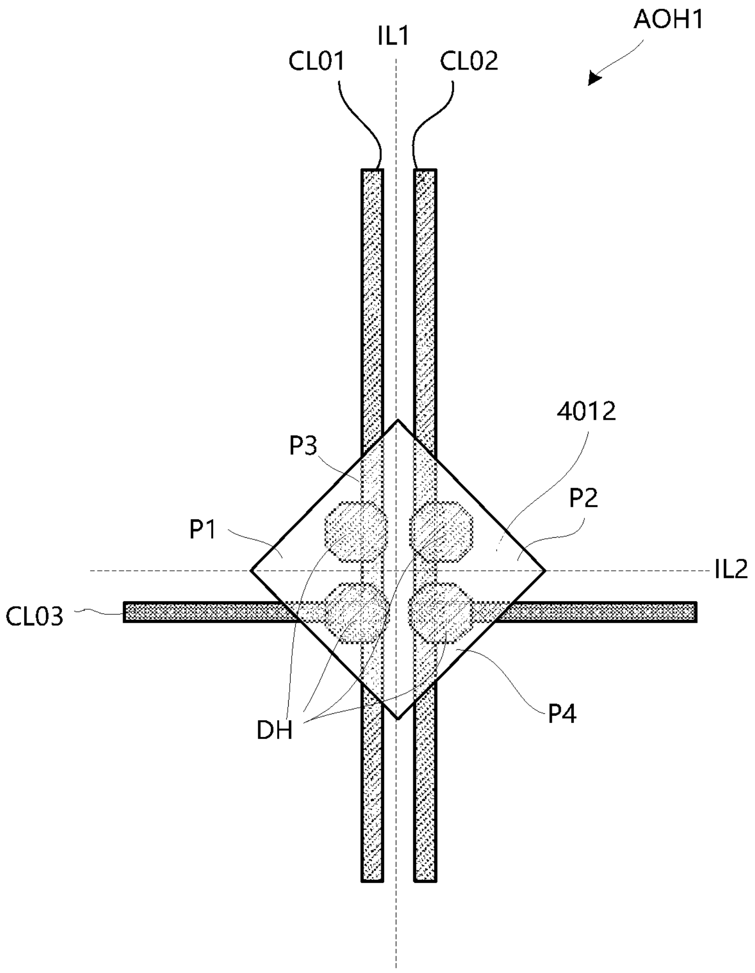
FIG. 10 is a partial enlarged view of a layer structure according to yet another embodiment of the present disclosure.

FIG. 10 is a partial enlarged view of a layer structure according to another embodiment of the present disclosure.

In some embodiments of the present disclosure, combining with FIG. 7A and FIG. 7B, FIG. 10 shows an arrangement of overlapping of a second anode 4012 of the light-emitting element with the connecting structure EH. Each second anode 4012 of the light-emitting element is overlapped with the dummy connecting structure DH. The first imaginary line IL1 and the second imaginary line IL2 are the imaginary symmetry axes of the second anode 4012. The dummy connecting structures DH are substantially symmetrical about the first imaginary line IL1 and/or the second imaginary line IL2. In this way, the connecting structures EH are evenly distributed under the anode 401 of the light-emitting element, thereby improving color shift.

The number of the connecting structures EH overlapped with the second anode 4012 is the same as the number of the connecting structures EH overlapped with the third anode 4013, so that the consistency of the protrusion in the anode areas of different light-emitting elements, thereby weakening color shift.

In some embodiments of the present disclosure, an overlapping structure formed by the second anode 4012 and the connecting structure EH is a first overlapping structure AOH1 (as shown in FIG. 10), and an overlapping structure formed by the third anode 4013 and the connecting structure EH is a second overlapping structure AOH2 (as shown in FIG. 9). The first overlapping structures AOH1 and the second overlapping structures AOH2 are arranged alternately along the first direction and the second direction. Although overlapping between the third anode 4013 and the connecting structure EH is not completely symmetrical about the second imaginary line IL2, the alternating arrangement of the first overlapping structures AOH1 and the second overlapping structures AOH2 along the first direction and the second direction can disrupt rhythm, thereby further weakening color shift.

In some embodiments of the present disclosure, in a second direction, a width of the connecting structure EH is greater than a line width of the data line or a line width of the data connecting line.

Figure 11A:
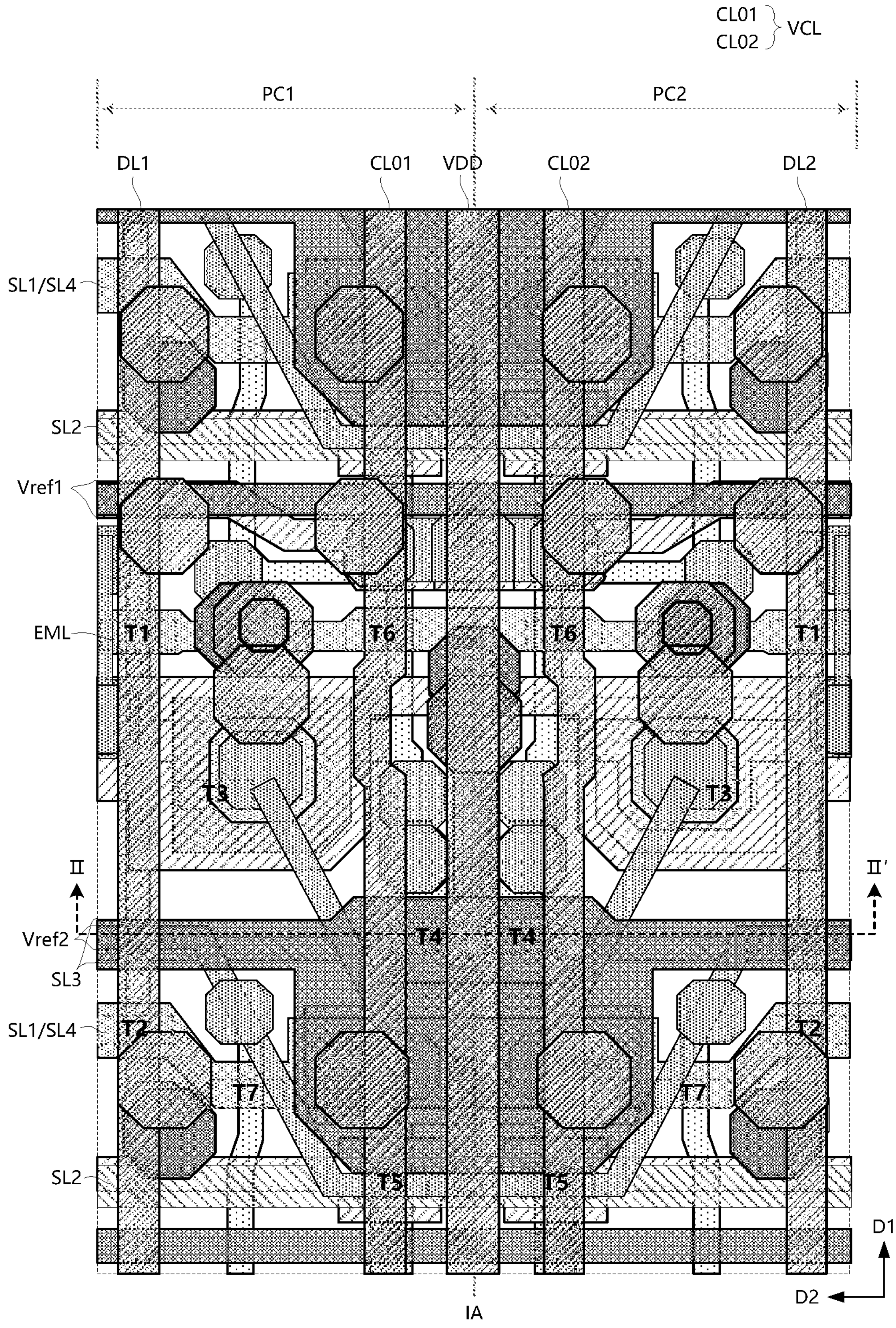
FIG. 11A is a schematic diagram showing another plan layout of thin film transistors and capacitors in a pixel circuit group according to another embodiment of the present disclosure.

FIG. 11A is a schematic diagram showing a plan layout of multiple thin film transistors and capacitors in a pixel circuit group according to another embodiment of the present disclosure.

Referring to FIG. 11A, a pixel circuit PC includes multiple wires extending along a first direction and multiple wires extending along a second direction, where the first direction crosses the second direction. The data line DL and the supply voltage signal line VDD extend in the first direction. The first scan line SL1, the second scan line SL2, the third scan line SL3, the fourth scan line SL4 and the light-emitting control signal line EML extend in the second direction.

The pixel circuit PC further includes transistors T1 to T7 and a storage capacitor Cst. Each of the transistors T1 to T7 can include a semiconductor pattern having a drain area, an active area, a source area, and a channel area between the active area and the drain area, and a gate insulated with the semiconductor layer at a position corresponding to the channel area. In other words, the gate overlaps with the semiconductor pattern at the channel area.

In some embodiments of the present disclosure, the pixel circuit can occupy smaller space to achieve a higher display resolution.

In some embodiments of the present disclosure, each of the transistors T4 and T5 includes an oxide semiconductor layer, and each of the transistors T1, T2, T3, T6, and T7 includes a silicon semiconductor layer.

Multiple pixel circuits PC can be arranged in the display area along the first direction and the second direction. FIG. 11A shows a pixel circuit group including pixel circuits adjacent to each other. The pixel circuit group includes a first pixel circuit PC1 and a second pixel circuit PC2. The first pixel circuit PC1 is arranged in a first column, and the second pixel circuit PC2 is arranged in a second column adjacent to the first column. The first pixel circuit PC1 and the second pixel circuit PC2 are at least partially symmetric with respect to an imaginary axis IA between the first pixel circuit PC1 and the second pixel circuit PC2. For example, the arrangement of the transistors T1 to T7 and the first storage capacitor Cst1 in the first pixel circuit PC1 is symmetric with the arrangement of the transistors T1 to T7 and the second storage capacitor Cst2 in the second pixel circuit PC2. In some embodiments of the present disclosure, considering the performance difference of the light-emitting pixels in actual situation, some of the transistors may be adjusted. For example, the semiconductor pattern in the drive transistor T3 of the first pixel circuit PC1 may be a straight line, so that it is different from the semiconductor pattern (U-shape) of the drive transistor in the second pixel circuit PC2 and actual requirements are met. In addition, for example, the position of the via of the node N1 in the first pixel circuit PC1 may be arranged to be different from the position of the via of the node N1 in the second pixel circuit PC2, thereby maintaining position consistency among different light-emitting pixels.

In the first pixel circuit PC1 and the second pixel circuit PC2, the first initialization supply voltage signal line Vref1, the second initialization supply voltage signal line Vref2, the first scan line SL1, the second scan line SL2, the third scan line SL3, the fourth scan line SL4, and the light-emitting control signal line EML extend in the second direction and are arranged at regular intervals from top to bottom.

The first pixel circuit PC1 and the second pixel circuit PC2 may share the supply voltage signal line VDD. The first data line DL1 and the second data line DL2 extend in the first direction and are parallel to the supply voltage signal line VDD. The first pixel circuit PC1 is connected to the first data line DL1, and the second pixel circuit PC2 is connected to the second data line DL2. The first data line DL1 is arranged to the left side of the first pixel circuit PC1, and the second data line DL2 is arranged to the right side of the second pixel circuit PC2. The first data line DL1 is arranged to the right side of the first pixel circuit PC1 and the second data line DL2 is arranged to the left side of the second pixel circuit PC2. Alternatively, the first-type data connecting line VCL extends in the first direction and parallel to the supply voltage signal line VDD. The first-type data connecting line VCL includes a first data connecting line CL01 and a second data connecting line CL02. The first data connecting line CL01 and the second data connecting line CL02 are respectively disposed on two sides of the supply voltage signal line VDD. The first data connecting line CL01 and the second data connecting line CL02 both at least partially overlap with the supply voltage signal line VDD. The first-type data connecting line VCL is disposed on a side adjacent to the imaginary axis IA, that is, the first data connecting line CL01 and the second data connecting line CL02 are arranged between two adjacent pixel circuits and are adjacent to each other.

The first pixel circuit PC1 and the second pixel circuit PC2 may share the supply voltage signal line VDD. The supply voltage signal line VDD is disposed between the first pixel circuit PC1 and the second pixel circuit PC2. The second electrode of the first storage capacitor Cst1 of the first pixel circuit PC1 and the second electrode of the second storage capacitor Cst2 of the second pixel circuit PC2 are connected to each other, and are electrically connected to the supply voltage signal line VDD through a contact hole between the first pixel circuit PC1 and the second pixel circuit PC2. In this way, the supply voltage is transmitted by a network structure with lateral line formed by the first storage capacitor Cst1 and the second storage capacitor Cst2 and longitudinal line formed by the supply voltage signal line VDD, and thus, the supply voltage has a smaller signal delay.

Figure 11B:
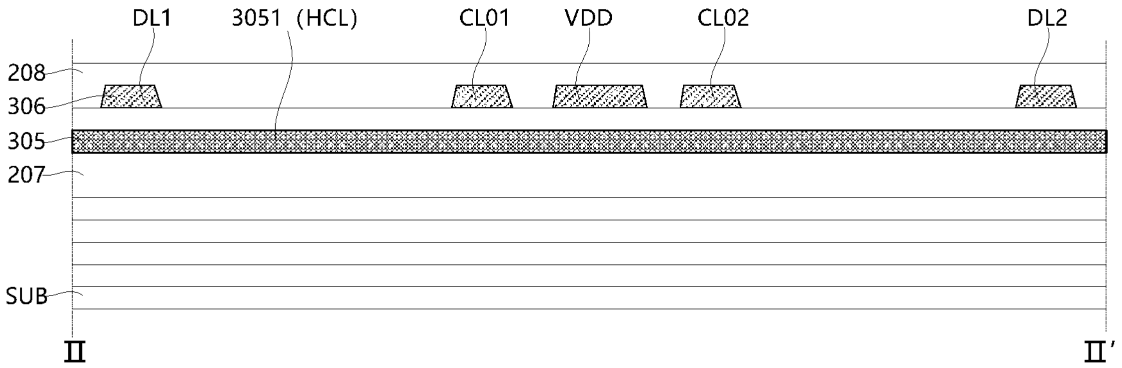
FIG. 11B is a cross-sectional view taken along line II-II' shown in FIG. 11A according to an embodiment of the present disclosure.

FIG. 12A to 12H are plan views of multiple layers in the pixel circuit group shown in FIG. 5A according to an embodiment of the present disclosure, respectively. FIG. 11B is a cross-sectional view taken along line II-If shown in FIG. 11A according to an embodiment of the present disclosure. Since this cross-sectional view only shows the layer relationship of the data connecting line CL, the data line DL and the supply voltage signal line VDD, some details of the drive circuit layer 10 and the light-emitting element layer 20 are omitted.

The display panel PD includes a substrate SUB, a drive circuit layer and a light-emitting element layer 20. The drive circuit layer 10 is disposed on the substrate SUB, and the light-emitting element layer 20 is disposed at a side of the drive circuit layer 10 away from the substrate SUB.

The drive circuit layer 10 includes a first semiconductor layer 101, a first insulating layer 201, a first conducting layer 301, a second insulating layer 202, a second conducting layer 302, a third insulating layer 203, a second semiconductor layer 102, a fourth insulating layer 204, a third conducting layer 303, a fifth insulating layer 205, a fourth conducting layer 304, a sixth insulating layer 206, a fifth conducting layer 305, a seventh insulating layer 207, a sixth conducting layer 306, an eighth insulating layer 208 and a pixel definition layer 209 that are sequentially stacked.

The first insulating layer 201, the second insulating layer 202, and the fourth insulating layer 204 are gate insulating layers. The third insulating layer 203 and the fifth insulating layer 205 are interlayer insulating layers. The first insulating layer 201, the second insulating layer 202, the third insulating layer 203, the fourth insulating layer 204 and the fifth insulating layer 205 are made of a material of at least one of silicon nitride or silicon oxide.

The sixth insulating layer 206, the seventh insulating layer 207 and the eighth insulating layer 208 are all organic planarization layers. The sixth insulating layer 206, the seventh insulating layer 207 and the eighth insulating layer 208 are made of a material of at least one of polyimide or polyacrylate.

The first semiconductor layer 101 is a low temperature poly silicon semiconductor layer. The first semiconductor layer 101 includes a third active pattern 1013 of the drive transistor T3, a second active pattern 1012 of the data writing transistor T2, a first active pattern 1011 of the first light-emitting control transistor T1, a sixth active pattern 1016 of the second light-emitting control transistor T6, and a seventh active pattern 1017 of the second initialization transistor T7. The first semiconductor layer further includes the active pattern of the thin film transistor in the pixel circuit.

The second semiconductor layer 102 is a metal oxide semiconductor layer. The second semiconductor layer 102 includes a fourth active pattern 1014 of the threshold compensation transistor T4, and a fifth active pattern 1015 of the first initialization transistor T5.

The second semiconductor 102 may be disposed as a polyline shape and include a first transition portion 1021. A width W1 of the first transition portion is larger than a width W2 of other portions of the oxide semiconductor.

The first conducting layer 301, the second conducting layer 302, the third conducting layer 303, the fourth conducting layer 304, the fifth conducting layer 305 and the sixth conducting layer 306 are made of a material selected from at least one of molybdenum, aluminum, titanium, copper and silver.

The first conducting layer 301 includes a third gate 3013 of the drive transistor T3, a second gate 3012 of the data writing transistor T2, a first gate 3011 of the first light-emitting control transistor T1, a sixth gate 3016 of the second light-emitting control transistor T6, and a seventh gate 3017 of the second initialization transistor T7. The first conducting layer 301 further includes a gate trace of the thin film transistor in the pixel circuit. The third gate 3013 of the drive transistor T3 is reused as a first plate of the storage capacitor Cst.

Each of the scan line SL1 and the scan line SL4 located in the first conducting layer 301 does not extend in the second direction with a same width. The first conducting layer 301 further includes a scan extending portion 3010. The scanning line and the scan extending portion 3010 may at least partially overlap with the oxide semiconductor layer, e.g., at least partially overlap with the first transition portion so as to form a capacitance. In this way, the capacitance between the node N1 and the scan line is increased, and the jump of the signal on the scan line causes the potential of the node N1 to rise, thereby reducing dark state voltage.

The second conducting layer 302 includes a second plate of the storage capacitor Cst, a fourth lower gate 3024 of the threshold compensation transistor T4, and a fifth lower gate 3025 of the first initialization transistor T5. The second conducting layer 302 further includes the initialization supply voltage signal line Vref1.

The third conducting layer 303 includes a fourth upper gate 3034 of the threshold compensation transistor T4 and a fifth upper gate 3035 of the first initialization transistor T5.

The fourth conducting layer 304 includes a node N1 connecting line segment 3041, a second initialization supply voltage signal line Vref2, a first initialization connecting portion 3042 and a supply voltage connecting portion 3043. The first initialization connecting portion 3042 extends in the second direction and at least partially overlaps with the first initialization signal line Vref1. The first initializing connecting portion 3042 is located between the first pixel circuit PC1 and the second pixel circuit PC2 that are adjacent to each other, that is, the first pixel circuit PC1 and the second pixel circuit PC2 share the first initializing connecting portion 3042. The first initializing connecting portion 3042 crosses with the imaginary axis IA, and is connected to the first initialization supply voltage signal line Vref1 through a via K3041 at the position overlapped with the imaginary axis IA.

The second initialization supply voltage signal line Vref2 extends non-straightly along the second direction and overlaps with at least part of the scan lines to minimize transmittance loss as much as possible.

The second initialization supply voltage signal line Vref2 extends non-straightly along the second direction, and at least partially overlaps with the fifth lower gate 3025 and the fifth upper gate 3035 of the first initialization transistor T5.

The second initialization supply voltage signal line Vref2 extends non-straightly along the second direction, and at least partially overlaps with the fourth lower gate 3024 and the fourth upper gate 3034 of the threshold compensation transistor T4.

The supply voltage connecting portion 3043 is located at a side of the drive transistor T3 away from the imaginary axis IA, i.e., the supply voltage connecting portion 3043 is located between adjacent pixel circuit groups. As shown FIG. 12H, the second pixel circuit PC2 and the first pixel circuit PC1 adjacent to each other share the supply voltage connecting portion 3043. A first end of the supply voltage connecting portion 3043 is connected to the second plate of the storage capacitance Cst through a via K3042, and a second end of the supply voltage connecting portion 3043 is connected to a first electrode of the first light-emitting control transistor T1 of the first pixel circuit PC1 and a first electrode of the first light-emitting control transistor T1 of the second pixel circuit PC2 through a via K3043.

Figure 12A:
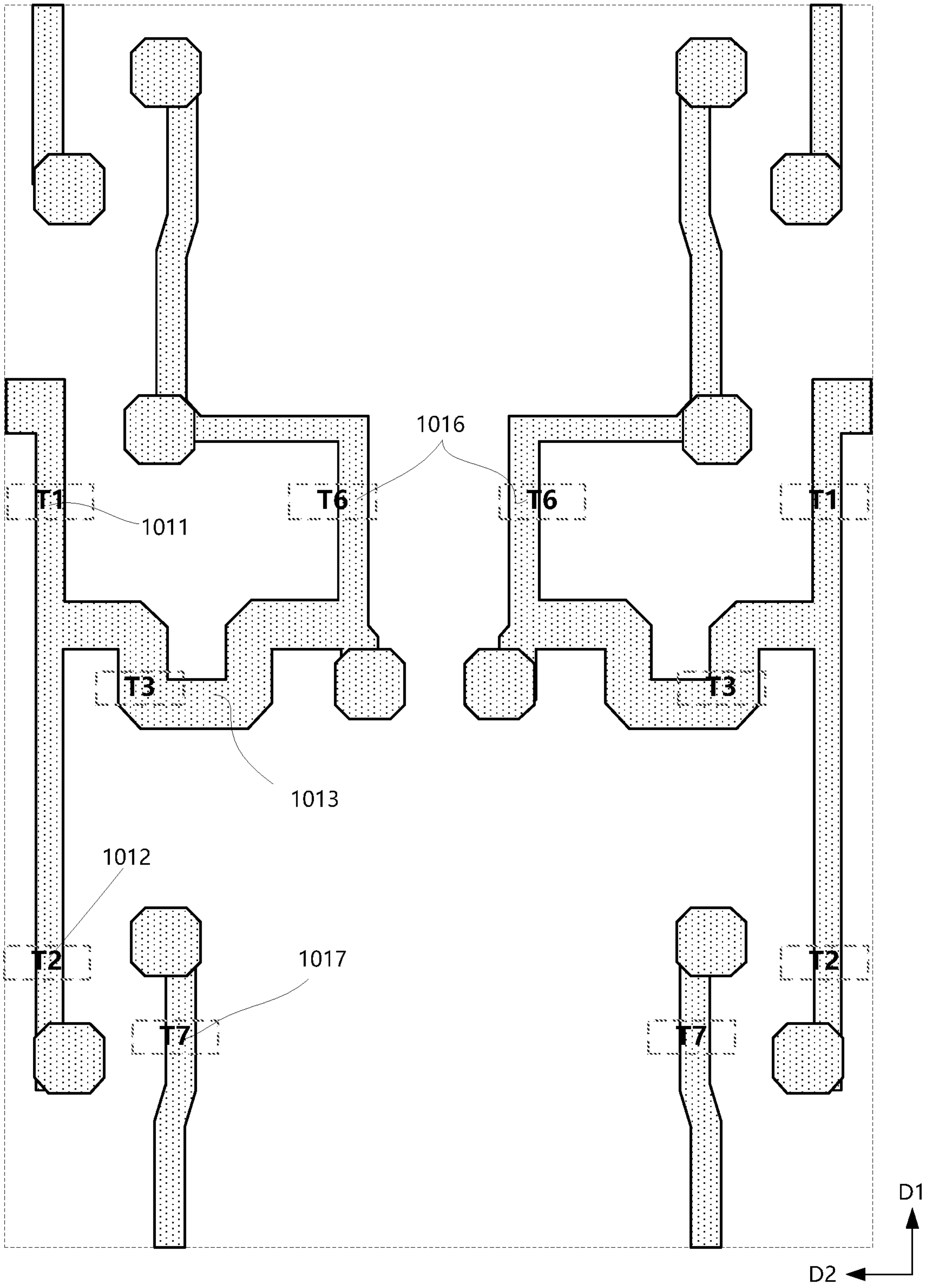
FIG. 12A-12H are plan views of multiple layers in the pixel circuit group shown in FIG. 5A according to an embodiment of the present disclosure, respectively.
Figure 12B:
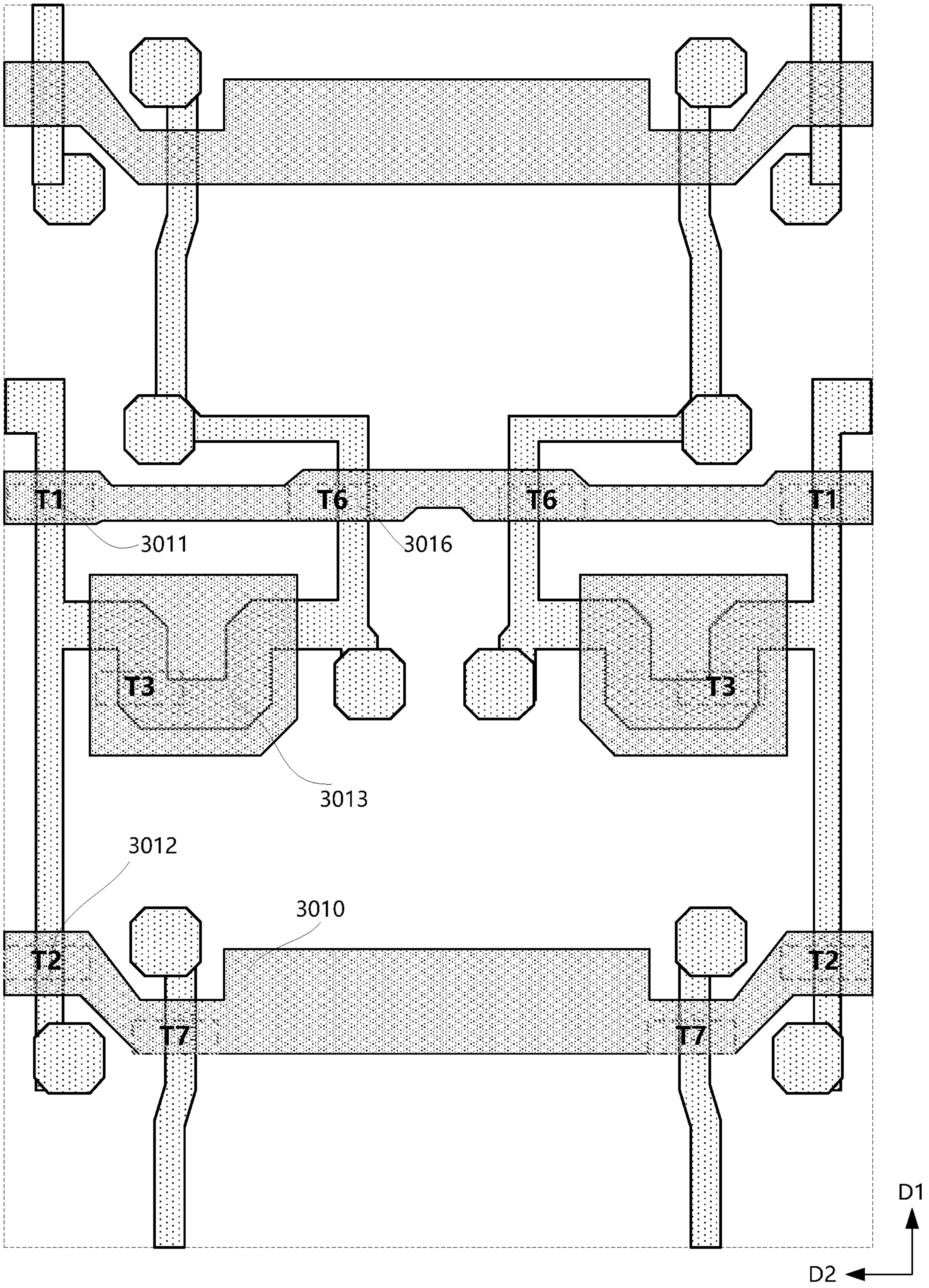
Figure 12C:
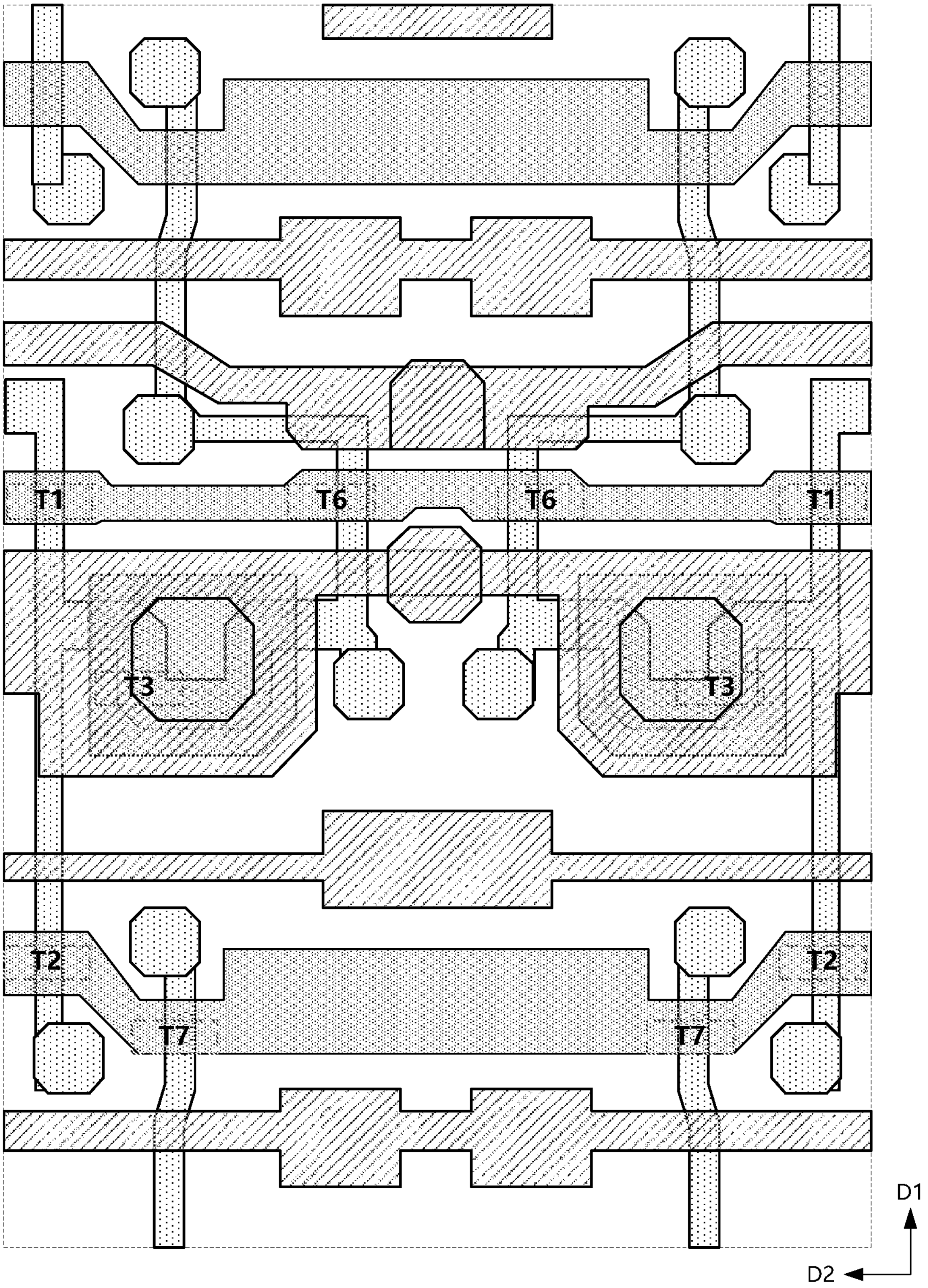
Figure 12D:
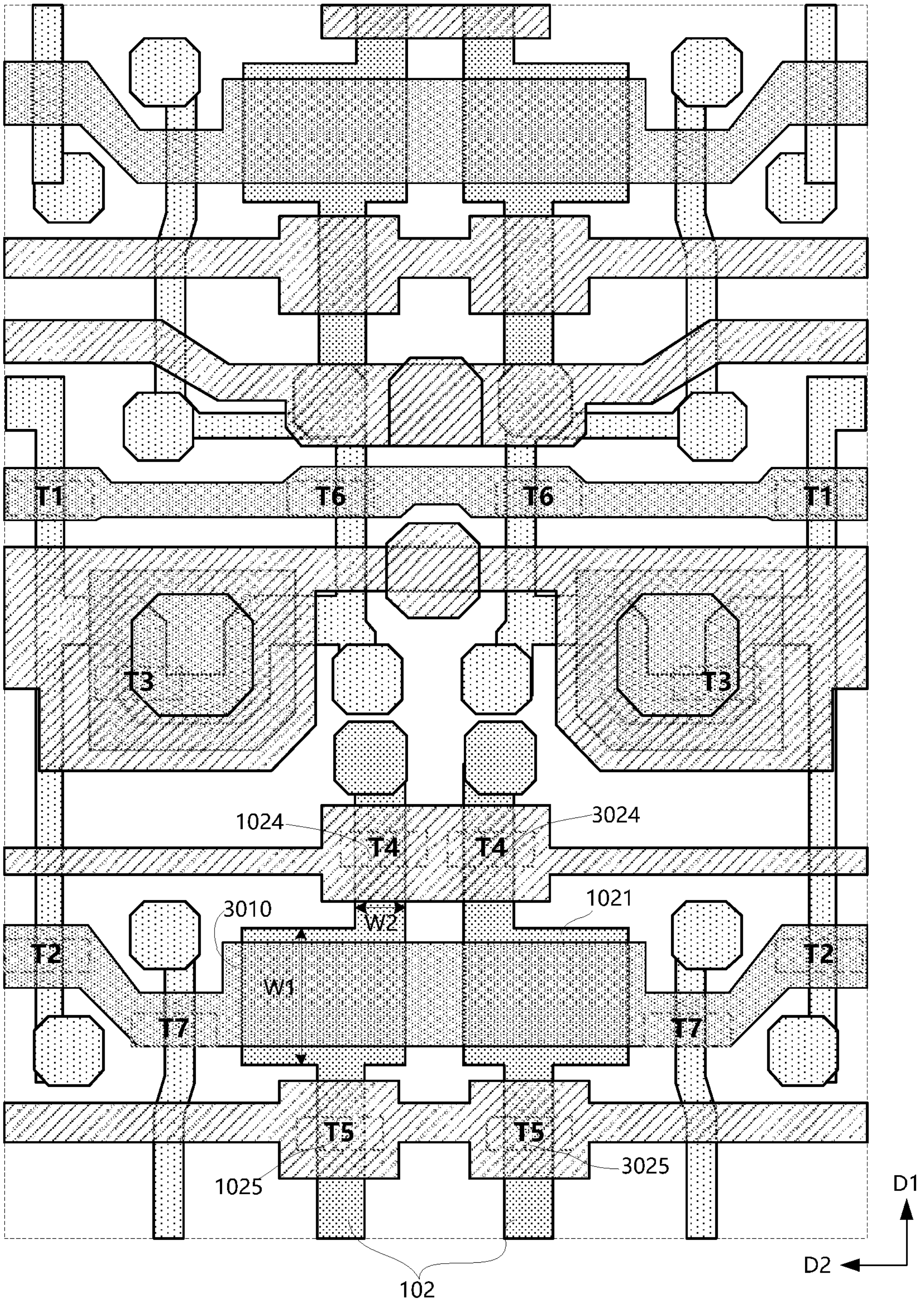
Figure 12E:
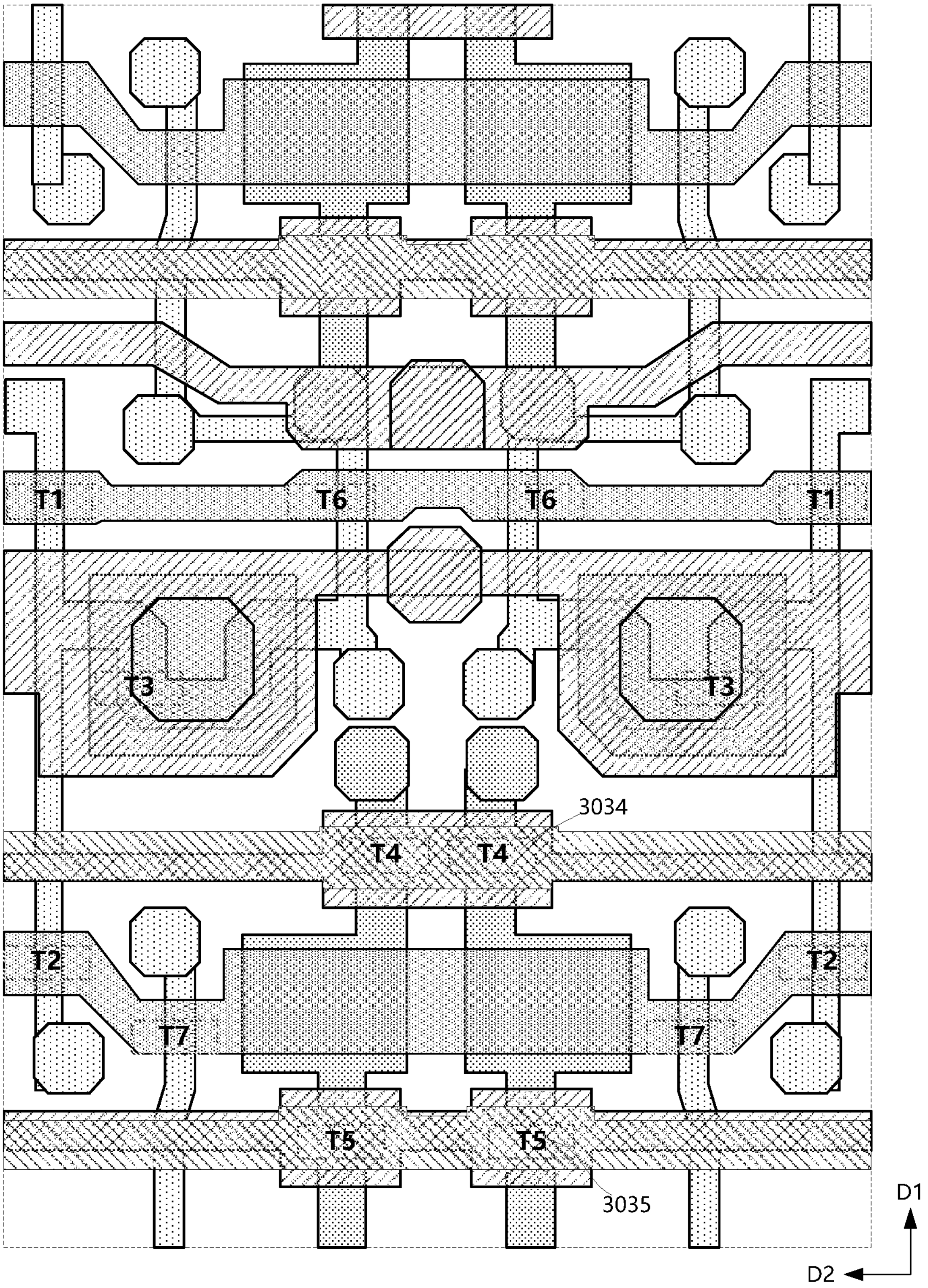
Figure 12F:
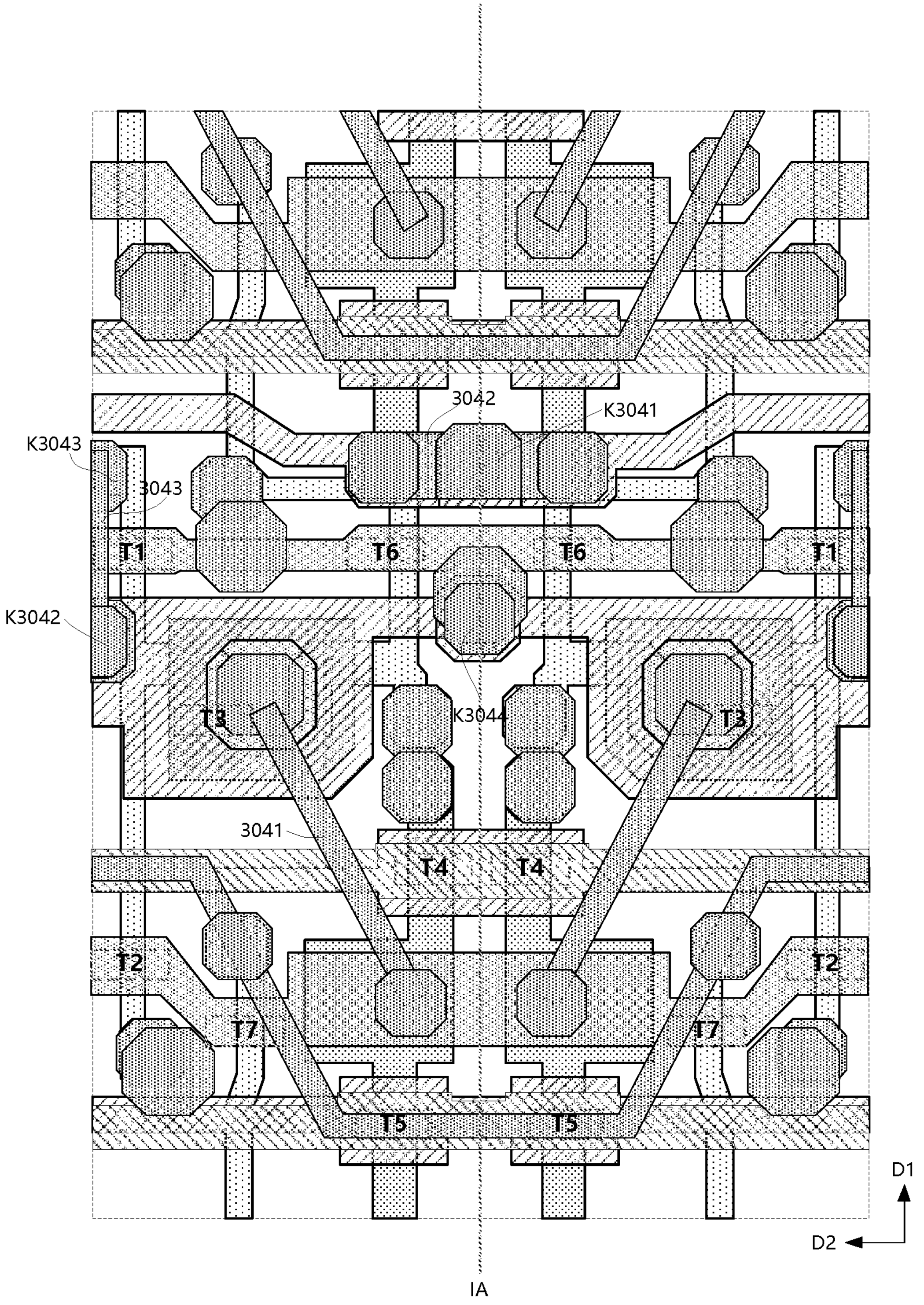
Figure 12G:
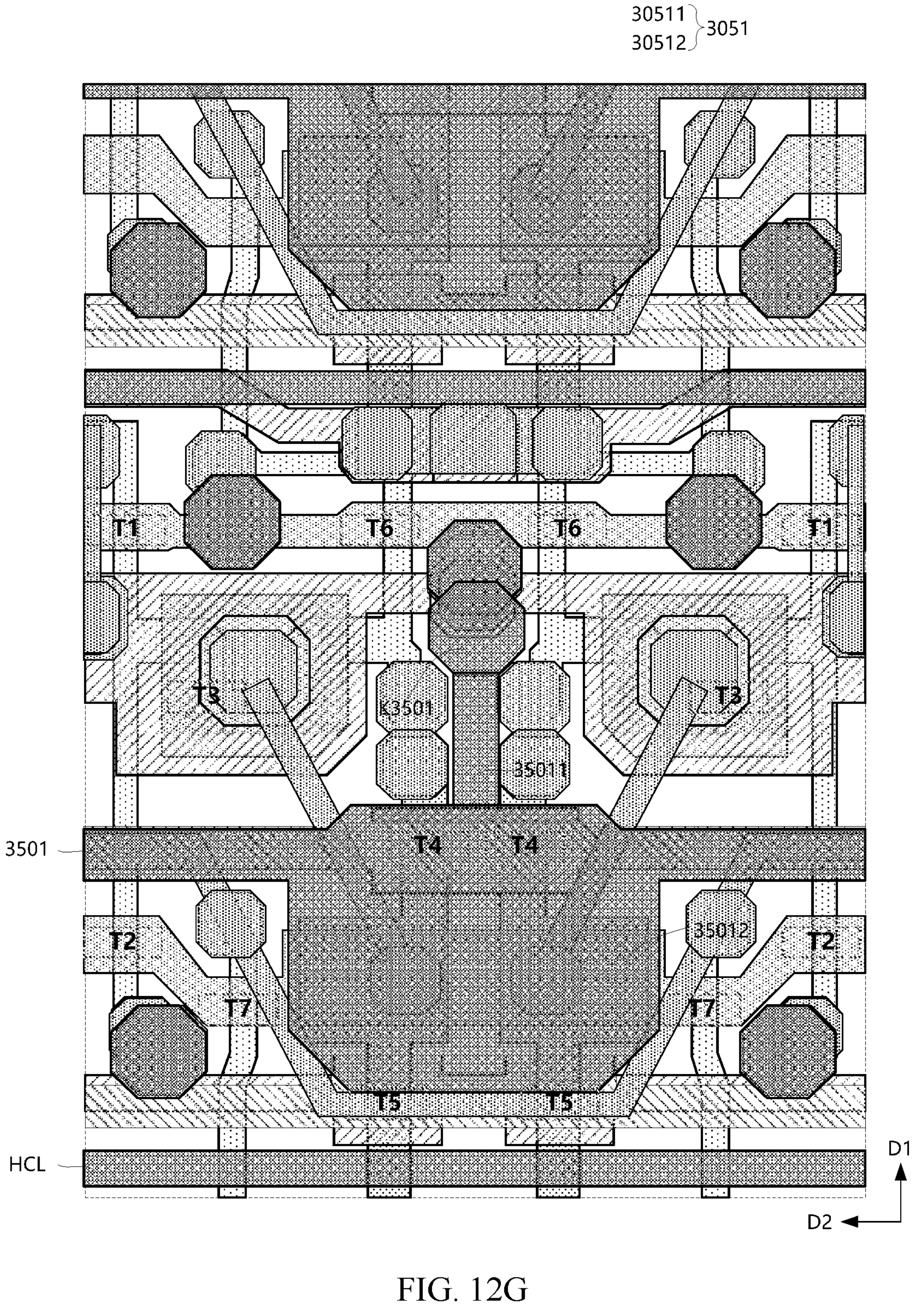
Figure 12H:
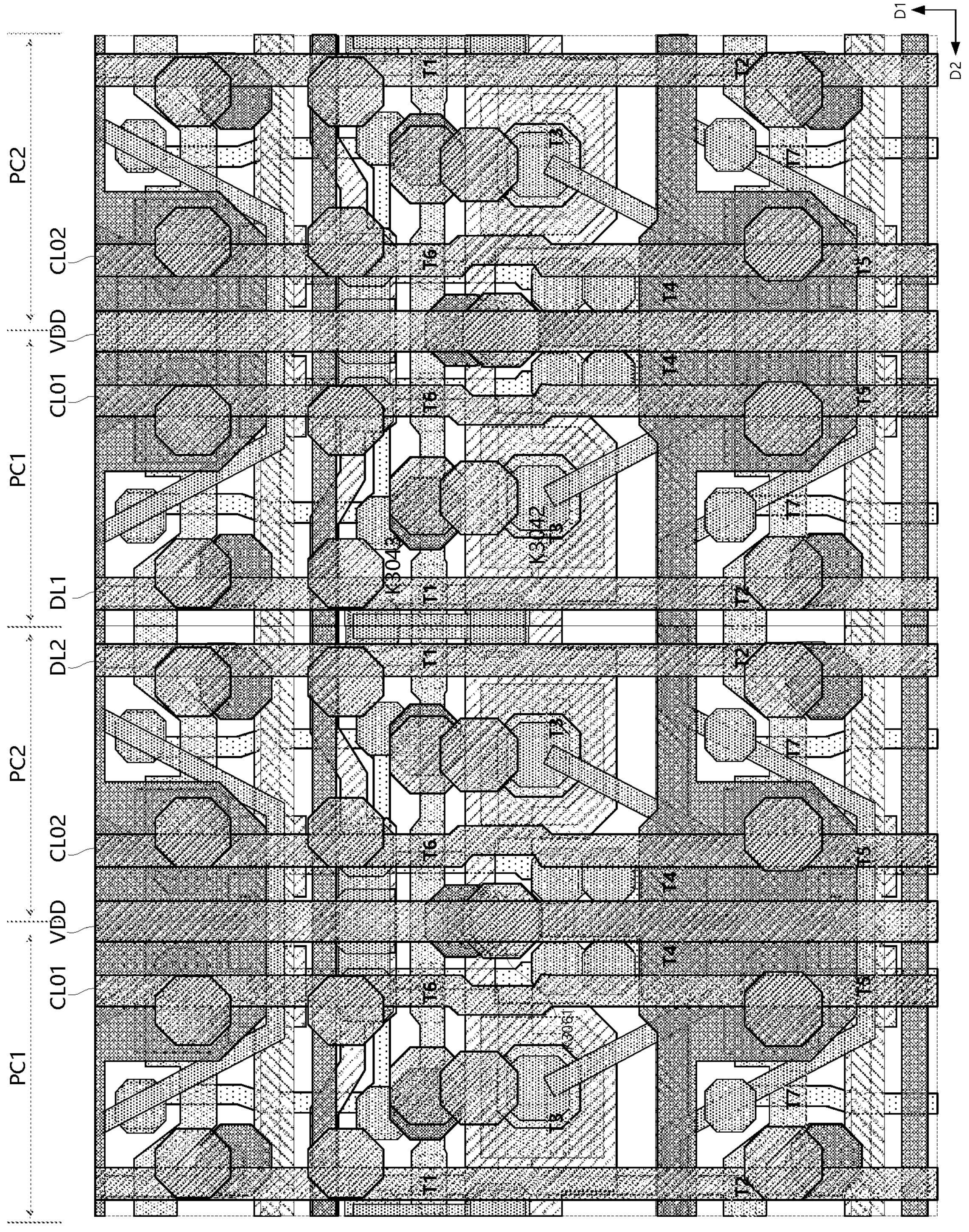

Referring to FIG. 12H, the supply voltage signal line VDD is connected to the second plate of the storage capacitor Cst through the via K3044, thus the supply voltage is transmitted in a grid structure. It can be seen that the supply voltage signal line VDD now inputs the supply voltage signal to the lateral integral second plate of the storage capacitor Cst, and the second plate of the storage capacitor Cst inputs the supply voltage signal to the supply voltage connecting portion 3043, thus inputting the supply voltage to the pixel circuit PC.

The fifth conducting layer 305 includes a second-type data connecting line HCL extending in the second direction and a shielding portion 3051. The shielding portion 3051 as a whole extends in the second direction and is connected to the fixed potential. The shielding portion 3051 includes a first convex portion 30511 and a second convex portion 30512 both protruding along the first direction. The first convex portion 30511 of the shielding portion 3051 extends toward the drive transistor T3, and is located between the first pixel circuit PC1 and the second pixel circuit PC2 adjacent to each other. Referring to FIG. 12H, the first convex portion 30511 is connected to the supply voltage signal line VDD through the via K3051, so that the supply voltage is transmitted in a grid structure. The second convex portion 30512 extends away from the drive transistor T3, and overlaps with a part of the oxide semiconductor (the first transition portion 1021) and the channel of the threshold compensation transistor T4. In this way, the effect of light illumination and other factors on the semiconductor is reduced, thereby preventing threshold drift. The second convex portion 30512 is located between the first pixel circuit PC1 and the second pixel circuit PC2 adjacent to each other, and is shared by the first pixel circuit PC1 and the second pixel circuit PC2.

The second-type data connecting line HCL is disposed between the scan line connected to the fifth gate of the first initialization transistor T5 and the light-emitting control signal line EML.

In some embodiments of the present disclosure, the second-type data connecting line HCL at least partially overlaps with the fixed voltage signal line, e.g., the second-type data connecting line HCL overlaps with the initialization supply voltage signal line Vref1. For example, the second-type data connecting line HCL at least partially overlaps with the first initialization supply voltage signal line Vref1. Since the first initialization supply voltage signal line Vref1 is at a fixed potential, the signal of the second-type data connecting line HCL is more stable.

In some embodiments of the present disclosure, the shielding portion 3051 at least partially overlaps with the scan line of at least one transistor, e.g., the shielding portion 3051 at least partially overlaps with the fourth gate of the fourth transistor T4. In this way, the shielding portion 3051 overlaps with other metals as much as possible without occupying other space, thereby ensuring a certain transmittance.

The sixth conducting layer 306 includes a data line DL, a first-type data connecting line VCL, and a supply voltage signal line VDD. That is, the data line DL, the first-type data connecting line VCL and the supply voltage signal line VDD are disposed in a same layer to optimize wire arrangement of the pixel circuit. The first-type data connecting line VCL, the data line DL and the supply voltage signal line VDD are substantially parallel to one another along the first direction. The first pixel circuit PC1 is connected to the first data line DL1, and the second pixel circuit PC2 is connected to the second data line DL2. The first data line DL1 is arranged on the left side of the first pixel circuit PC1, and the second data line DL2 is arranged on the right side of the second pixel circuit PC2. Alternatively, the first data line DL1 is arranged on the right side of the first pixel circuit PC1, and the second data line DL2 is arranged on the left side of the second pixel circuit PC2. That is, the first data line DL1 and the second data line DL2 are arranged at a side away from the imaginary axis IA between two adjacent pixel circuits, and are arranged between two adjacent pixel circuits and are adjacent to each other, e.g., completely adjacent to each other. The first-type data connecting line VCL includes a first data connecting line CL01 and a second data connecting line CL02. The first data connecting line CL01 is configured in the area of the first pixel circuit PC1, and the second data connecting line CL02 is configured in the area of the second pixel circuit PC2. The first data connecting line CL01 is located a side adjacent to the imaginary axis between the first pixel circuit PC1 and the second pixel circuit PC2. The second data connecting line CL02 is located a side adjacent to the imaginary axis between the first pixel circuit PC1 and the second pixel circuit PC2. The first data connecting line CL01 is arranged on the right side of the first pixel circuit PC1, and the second data connecting line CL02 is arranged on the left side of the second pixel circuit PC2. The first data connecting line CL01 is arranged on the left side of the first pixel circuit PC1, and the second data connecting line CL02 is arranged on the right side of the second pixel circuit PC2. If the first data line DL1 and the second data line DL2 are considered to be one first trace group, and the first data connecting line CL01 and the second data connecting lien CL02 are considered to be one second trace group, the first trace groups and the second trace groups are alternatively arranged. The first data connecting line CL01 at least partially overlaps with the silicon semiconductor and the oxide semiconductor, so that the effect of light illumination and other factors on the semiconductor is reduced, thereby preventing threshold drift. In some embodiments of the present disclosure, the first data connecting line CL01 overlaps with the shielding portion 3051 and/or the second convex portion 30512 to stabilize the signal transmitted through the first data connecting line CL01, preventing crosstalk with adjacent data signals. The second data connecting line CL02 at least partially overlaps with the silicon semiconductor and the oxide semiconductor, so that the effect of light illumination and other factors on the semiconductor is reduced, thereby preventing threshold drift. In some embodiments of the present disclosure, the second data connecting line CL02 overlaps with the shielding portion 3051 and/or the second convex portion 30512 to stabilize the signal on the second data connecting line CL02, preventing crosstalk with adjacent data signals.

In some embodiments of the present disclosure, the first data connecting line CL01 and the second data connecting line CL02 have a polyline design at the via K3061, i.e., the first data connecting line CL01 and the second data connecting line CL02 do not extend completely in a straight line, and have a polyline design at a side adjacent to the driver transistors T3. The first data connecting line CL01 and the second data connecting line CL02 overlap with the second plate of the storage capacitor Cst, optimizing the wiring arrangement.

In some embodiments of the present disclosure, the data lines DL may be located in one layer, while the first-type data connecting line HCL and the second-type data line VCL are located in a same layer, but the present disclosure is not limited thereto.

Figure 13A:
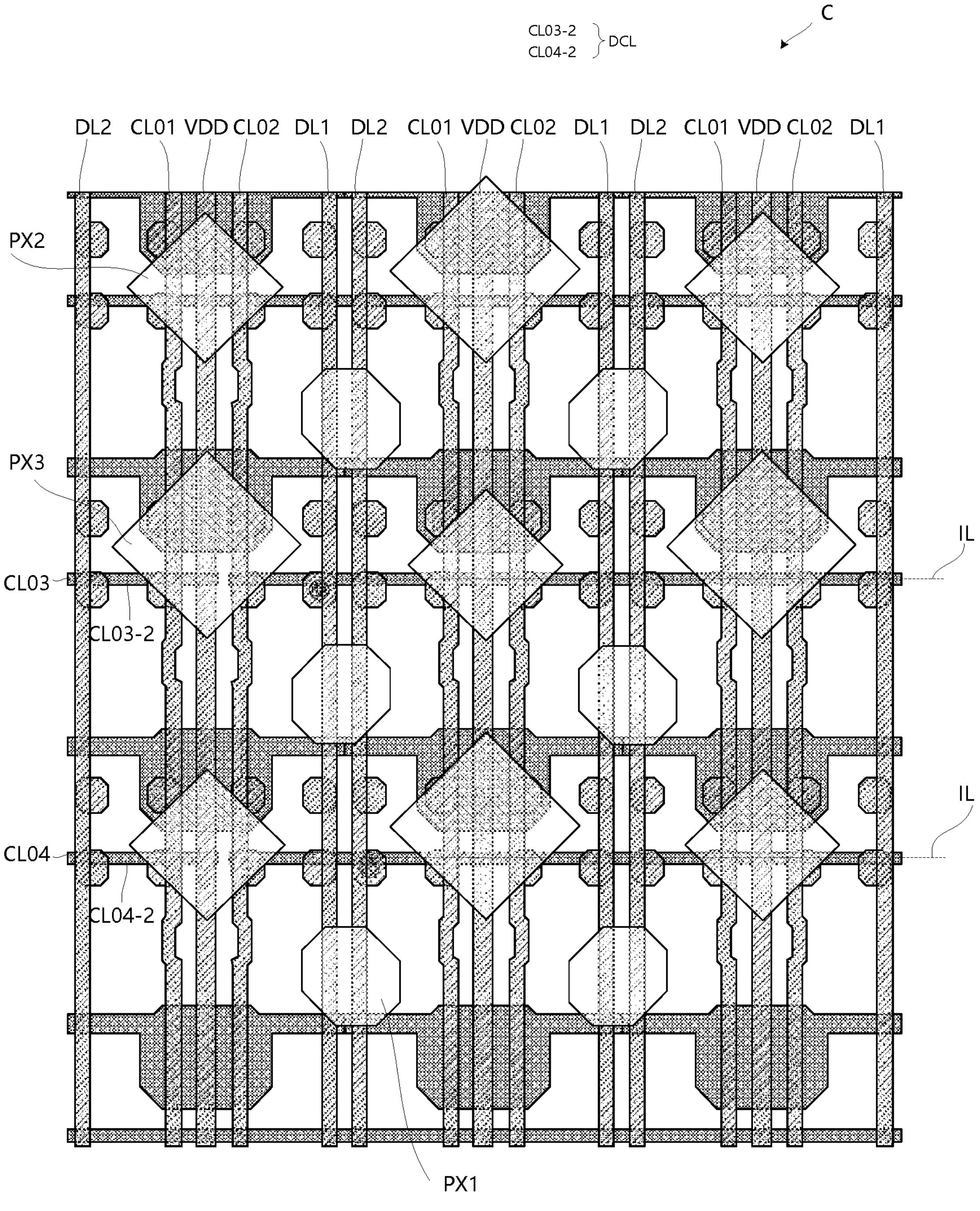
FIG. 13A is a structural schematic diagram of layers in an area C shown in FIG. 3 according to an embodiment of the present disclosure.
Figure 13B:
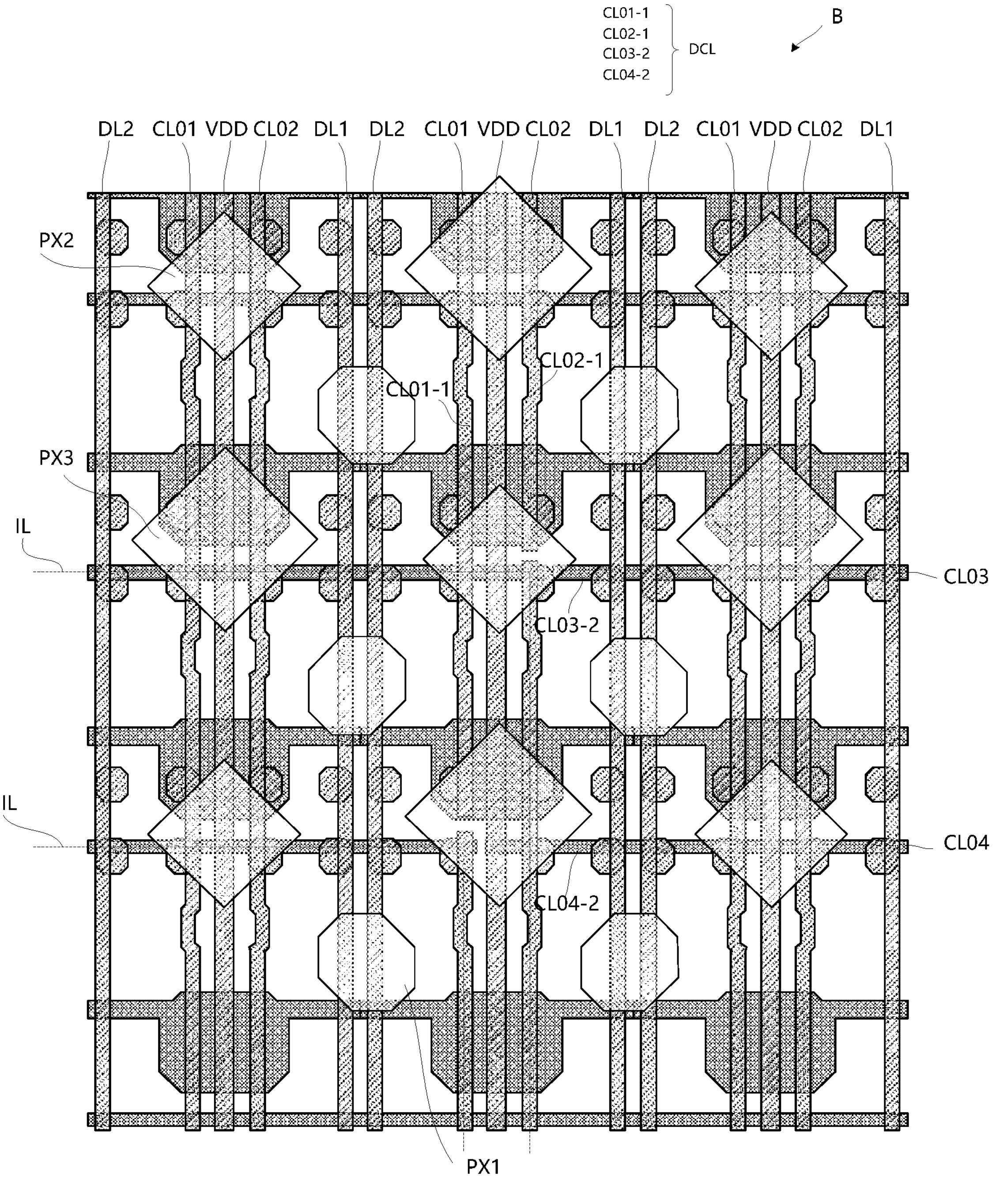
FIG. 13B is a structural schematic diagram of layers in an area B shown in FIG. 3 according to an embodiment of the present disclosure.

FIG. 13A is a structural schematic diagram of layers in an area C shown in FIG. 3 according to an embodiment of the present disclosure. FIG. 13B is a structural schematic diagram of layers in an area B shown in FIG. 3 according to an embodiment of the present disclosure. As shown in FIG. 11A and FIG. 12A to 12H, pixel circuit groups are arranged in the first direction and in the second direction. The first data line DL1 and the second data line DL2 are arranged between adjacent pixel circuit groups and are adjacent to each other. For example, they are completely adjacent to each other, that is, no other signal lines are located between the first data line DL1 and the second data line DL2. In other words, the first data connecting line CL01 and the second data connecting line CL02 are arranged between adjacent data line groups and are adjacent to each other.

Figure 14:
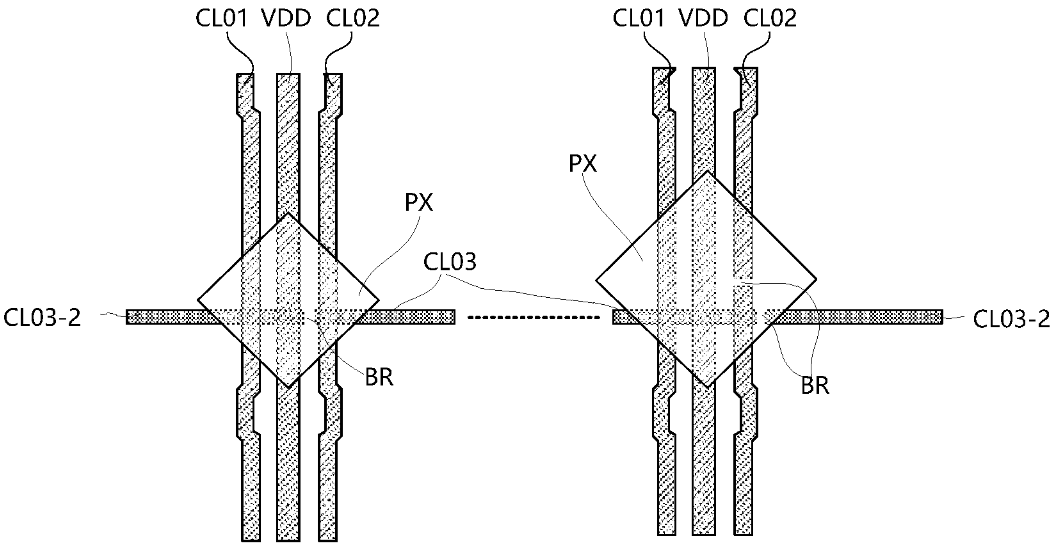
FIG. 14 is a partial enlarged view of a layer structure according to an embodiment of the present disclosure.

FIG. 14 is a partial enlarged view of a layer structure according to another embodiment of the present disclosure. FIG. 13A and FIG. 13B further show that the embodiment of the data connecting lines CL and the relative position relationship between the data connecting lines CL and the light-emitting element. Referring to FIG. 13A and FIG. 13B, the signal of pad area BP is transmitted to corresponding data connecting line such as the second data connecting line CL02. The second data line connecting CL02 includes a second data connecting dummy line CL02-1. The second data connecting dummy line CL02-1 and the second data connecting line CL02 are disconnected by a breaking BR. The second-type data connecting line HCL includes a third data connecting line CL03. The third data connecting line CL03 includes a third data connecting dummy line CL03-2. The third data connecting line CL03 and the third data connecting dummy line CL03-2 are disconnected by a breaking BR. The second data connecting line CL02 and the third data connecting line CL03 are electrically connected. As shown in FIG. 13B, the path shown by the dotted line (imaginary line) IL forms a conductive path. One end of the third data connecting line CL03 is connected to the data line, e.g., the second data line DL2, thereby achieving transmission of the data signal. The data connecting dummy line DCL is connected to the fixed potential.

In some embodiments of the present disclosure, the data lines are adjacent to each other, and/or the data connecting lines are adjacent to each other, so that the interference between different types of signal lines can be improved. In addition, the signal lines adjacent to each other transmit signals of the same type, e.g., the adjacent signal lines both are data lines, or the adjacent signal lines both are data connecting lines. There are small differences in manufacturing processes of the adjacent signal lines, such as line width and film thickness. Due to similarity of functions, when the light-emitting element overlaps with a same type of signal lines, related structures can further be flexibly set to further improve the flatness of the anode, thereby weakening color shift. In addition, the data lines are adjacent to each other and/or the data connecting lines are adjacent to each other, so that the number of data lines under specific light-emitting elements can be flexibly adjusted to improve the coupling of data line to the anode due to signal jump, thereby improving light-emitting effect. For example, according to the requirements, the data line may be selectively placed only below the anode of the green light-emitting element, or only below the anode of the red/blue light-emitting element, i.e., only one data line may be selected to be placed under the anode of the light-emitting element, and the other data line may be connected to a fixed potential, thereby increasing adjustment flexibility of display effect of the panel.

The pixel definition layer 209 includes pixel openings. The pixel definition layer 209 is an organic insulating layer.

The light-emitting element layer 20 includes an anode 401, an organic light-emitting layer 402 and a cathode 403. The organic light-emitting layer 402 is located between the anode 401 and the cathode 403. The anode 401 is disposed corresponding to the pixel opening, and the pixel opening exposes a portion of the anode 401. The organic light-emitting layer 402 is located in the pixel opening.

The light-emitting element layer 20 includes multiple light-emitting elements such as a first light-emitting element PX1, a second light-emitting element PX2, and a third light-emitting element PX3. The anode 401 corresponding to the corresponding first light-emitting element PX1 is labeled as 4011, the anode 401 corresponding to the second light-emitting element PX2 is labeled as 4012, and the anode 401 corresponding to the third light-emitting element PX3 is labeled as 4013. Multiple light-emitting elements may form a patterns such as a diamond arrangement, a π arrangement and the like. A diamond-like arrangement is taken as an example in the present disclosure, which is not limited in the present disclosure.

Referring to FIG. 14, the breaking BR formed between the data connecting line and the dummy data connecting line DCL is located below the anode 401 of the light-emitting element, that is, the anode 401 of the light-emitting element 20 overlaps with the breaking BR, which can eliminate visibility of the breaking BR and improve the display effect of the display panel.

Figure 15:
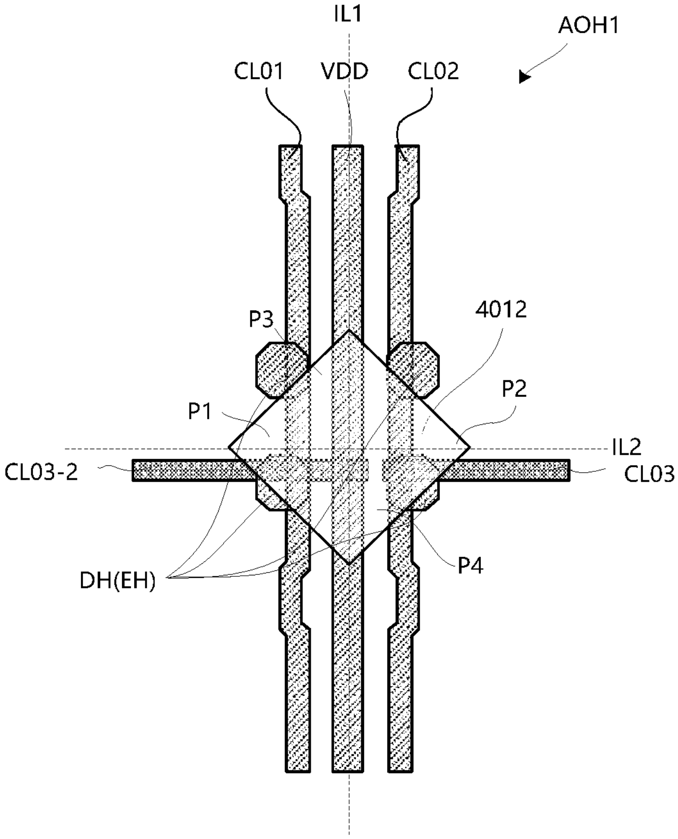
FIG. 15 is a partial enlarged view of a layer structure according to another embodiment of the present disclosure.

FIG. 15 is a partial enlarged view of a layer structure according to another embodiment of the present disclosure.

In some embodiments of the present disclosure, combining with FIG. 13A and FIG. 13B, FIG. 15 shows an arrangement of overlapping of a second anode 4012 of the light-emitting element with the connecting structure EH. A first imaginary line IL1 and a second imaginary line IL2 are imaginary symmetry axes of the second anode 4012. The supply voltage signal line VDD extends along the first imaginary line IL, i.e., the supply voltage signal line extends through the central position of the second anode 4012. That is, the second anode 4012 is substantially symmetrical about the supply voltage signal line VDD. Due to a small distance between the connecting structure and the anode 401, the connecting structure will make a portion of the anode corresponding to the connecting structure higher than other portions of the anode. In the plan view, a protrusion caused by connecting structure may be observed, which makes the anode uneven and further results in a color shift problem. The anode 401 is divided into a first portion P1 and a second portion P2 by the first imaginary line ILL When the protrusions of the anode are located adjacent to the first imaginary line IL1, the protrusions are evenly distributed in the first portion P1 and the second portion P2, which can weaken color shift compared with the protrusions located only in the first part P1 or only in the second portion P2.

In some embodiments of the present disclosure, in a second direction, a width of the connecting structure EH is greater than a line width of the data line or a line width of the data connecting line.

The second anode 4012 further overlaps with the connecting structure EH. The second anode 4012 of the light-emitting element overlaps with the dummy connecting structure DH. The first imaginary line IL1 and the second imaginary line IL2 are imaginary symmetry axes of the second anode 4012. The anode 401 is divided into a first portion P1 and a second portion P2 by the first imaginary line ILL A number of the connecting structure EH overlapped with the first portion P1 is the same as a number of the connecting structure EH overlapped with the second portion P2. The anode 401 is divided into a third portion P3 and a fourth portion P4 by the second imaginary line IL2. A number of the connecting structure EH overlapped with the third portion P3 is the same as a number of the connecting structure EH overlapped with the fourth portion P4. Dummy connecting structures DH are substantially evenly distributed in four areas formed by the first imaginary line IL1 and the second imaginary line IL2, so that the connecting structures EH are evenly distributed under the anode 401 of the light-emitting element, thereby improving color shift.

Figure 16:
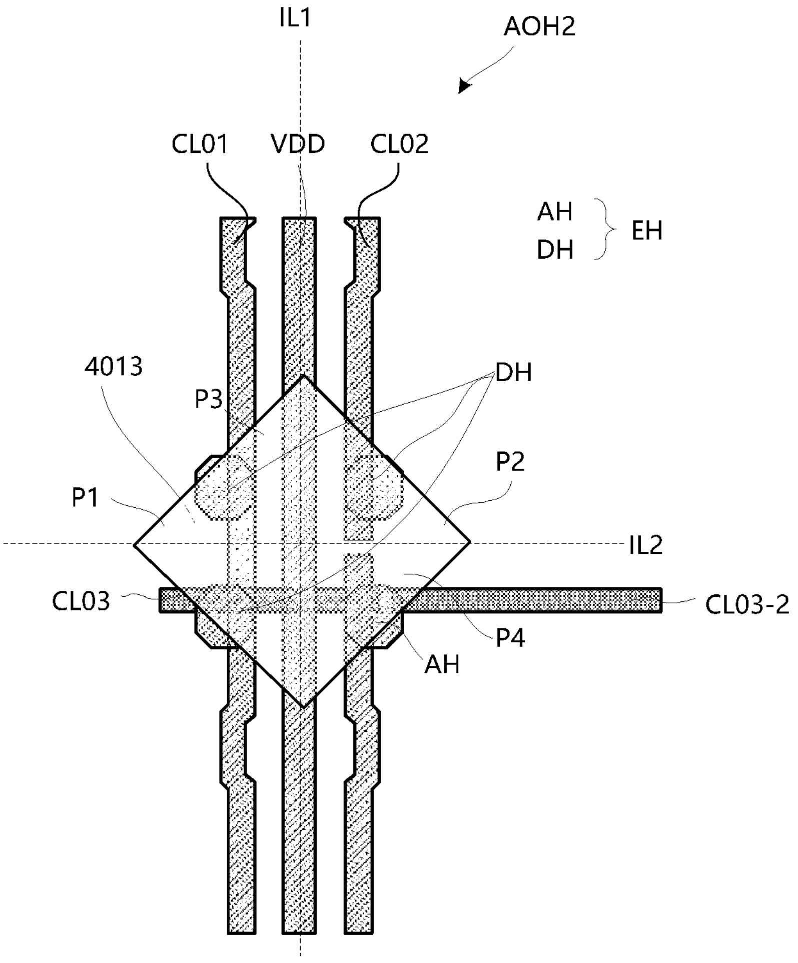
FIG. 16 is a partial enlarged view of a layer structure according to another embodiment of the present disclosure.

FIG. 16 is a partial enlarged view of a layer structure according to another embodiment of the present disclosure.

In some embodiments of the present disclosure, combining with FIG. 13A and FIG. 13B, FIG. 16 shows an arrangement of overlapping of a third anode 4013 of the light-emitting element with the connecting structure EH.

The connecting structures include an effective connecting structure AH between a second data connecting line CL02 and a third data connecting line CL03 and/or a dummy connecting structure DH. The dummy connecting structure is a film structure/metal pad arranged in corresponding position according to the actual requirements, but actually is not connected to adjacent signal lines. In the area shown in FIG. 16, there is actually only one effective connecting structure AH. The anode 401 is divided into a first portion P1 and a second portion P2 by the first imaginary line ILL A number of the connecting structure EH overlapped with the first portion P1 is the same as a number of the connecting structure EH overlapped with the second portion P2. The anode 401 is divided into a third portion P3 and a fourth portion P4 by a second imaginary line IL2. A number of the connecting structure EH overlapped with the third portion P3 is the same as a number of the connecting structure EH overlapped with the fourth portion P4. Dummy connecting structures DH are substantially evenly distributed in four areas formed by the first imaginary line IL1 and the second imaginary line IL2, so that the connecting structures EH are evenly distributed under the anode 401 of the light-emitting element, thereby improving color shift. The number of the connecting structure EH here is not limited, which can be one or more.

In some embodiments of the present disclosure, the number of the connecting structure EH overlapped with the second anode 4012 is the same as the number of the connecting structure EH overlapped with the third anode 4013, so that the consistency of the protrusion in the anode areas of different light-emitting elements, thereby weakening color shift.

In some embodiments of the present disclosure, an overlapping structure formed by the second anode 4012 and the connecting structure EH is a first overlapping structure AOH1 (as shown in FIG. 15), and an overlapping structure formed by the third anode 4013 and the connecting structure EH is a second overlapping structure AOH2 (as shown in FIG. 16). The first overlapping structures AOH1 and the second overlapping structures AOH2 are arranged alternately along the first direction and the second direction. Although overlapping between the third anodes 4013 and the connecting structures EH is not completely symmetrical about the second imaginary line IL2, the alternating arrangement of the first overlapping structures AOH1 and the second overlapping structures AOH2 along the first direction and the second direction can disrupt rhythm, thereby further weakening color shift.

Figure 17:
FIG. 17 is a schematic diagram of an electronic apparatus according to another embodiment of the present disclosure.

The present disclosure further provides an electronic apparatus. FIG. 17 is a schematic diagram of an electronic apparatus according to another embodiment of the present disclosure. As shown in FIG. 17, the electronic apparatus includes the above display panel PD. The specific structure of the display panel PD has been explained in detail in the above embodiments, which will not be repeated here. It can be appreciated that the electronic apparatus shown in FIG. 17 is only a schematic illustration. The electronic apparatus can be any electronic device with display function, such as a mobile phone, a watch, a laptop computer, an electronic paper book, or a television.

The above are merely some embodiments of the present disclosure, which, as mentioned above, are not used to limit the present disclosure. Whatever within the principles of the present disclosure, including any modification, equivalent substitution, improvement, etc., shall fall into the protection scope of the present disclosure.

Finally, it should be noted that the technical solutions of the present disclosure are illustrated by the above embodiments, but are not intended to be limit by the above embodiments. Although the present disclosure has been described in detail with reference to the foregoing embodiments, those skilled in the art can understand that the present disclosure is not limited to the specific embodiments described herein, and can make various obvious modifications, readjustments, and substitutions without departing from the scope of the present disclosure.

What is claimed is:

1. A display panel comprising:

a substrate comprising a display area and a pad area;

a first thin film transistor comprising a silicon semiconductor pattern and a first gate, wherein the silicon semiconductor pattern comprises a drain area, an active area and a source area, and the first gate overlaps with the active area of the silicon semiconductor pattern;

a second thin film transistor comprising an oxide semiconductor pattern and a second gate, wherein the oxide semiconductor pattern comprises a drain area, an active area and a source area, and the second gate overlaps with the active area of the oxide semiconductor pattern;

data lines extending along a first direction in the display area;

data connecting lines arranged in the display area and located at a side of the second gate away from the substrate, wherein the data connecting lines are connected to the data lines respectively, and configured to transmit data signals from the pad area to the data lines; and pixel circuit groups arranged along the first direction and a second direction in the display area, wherein each of the pixel circuit groups comprises a first pixel circuit and a second pixel circuit, and the first pixel circuit and the second pixel circuit are at least partially symmetric with respect to an imaginary axis extending between the first pixel circuit and the second pixel circuit, wherein each first pixel circuit of the pixel circuit groups is connected to a first data line of the data lines, each second pixel circuit of the pixel circuit groups is connected to a second data line of the data lines, and wherein for each pixel circuit group, the first data line and the second data line are arranged between the first pixel circuit and the second pixel circuit and are adjacent to each other.

2. The display panel according to claim 1, wherein the data connecting lines comprise first-type data connecting lines, and the first-type data connecting line comprise a first data connecting line and a second data connecting line both extending in a same direction as the data lines, the first data connecting line is arranged in an area of the first pixel circuit, the second data connecting line is arranged in an area of the second pixel circuit, and the first data connecting line and the second data connecting line are arranged between two adjacent pixel circuit groups of the pixel circuit groups and are adjacent to each other, and a first trace group comprises the first data line and the second data line, a second trace group comprises the first data connecting line and the second data connecting line, and the first trace group and the second trace group are arranged alternately along the second direction.

3. The display panel according to claim 2, wherein the data connecting lines further comprise second-type data connecting lines, and the second-type data connecting lines extend along the second direction and are located at a side of a first-type data lines adjacent to the substrate, the display panel further comprises a shielding portion disposed in a same layer with the second-type data connecting lines, wherein the shielding portion as a whole extends in the second direction and is connected to a fixed potential, the pixel circuit groups comprise scanning lines extending along the second direction, and the shielding portion at least partially overlaps with at least one of the scanning lines, the first thin film transistor is a drive transistor, and the shielding portion comprises a first convex portion protruding along the first direction and extending toward the first thin film transistor and wherein the first convex portion overlaps with at least a part of a first node connecting segment, the shielding portion further comprises a second convex portion protruding along the first direction and extending away from the first thin film transistor, and the second convex portion at least partially overlaps with the second thin film transistor, the display panel further comprises a drive circuit layer disposed on the substrate, wherein the drive circuit layer comprises a first semiconductor layer and a second semiconductor layer, the first semiconductor layer is a low temperature polycrystalline silicon semiconductor layer, the second semiconductor layer is a metal oxide semiconductor layer, the second semiconductor layer is arranged in a polyline that comprises a first transition portion, and a width of the first transition portion is greater than a width of a remaining portion of the second semiconductor layer, and the second convex portion at least partially overlaps with the first transition portion.

4. The display panel according to claim 1, wherein the data lines and the data connecting lines are disposed in a same layer, the display panel further comprises a drive circuit layer disposed on the substrate, the drive circuit layer comprises a first semiconductor layer, a first insulating layer, a first conducting layer, a second insulating layer, a second conducting layer, a third insulating layer, a second semiconductor layer, a fourth insulating layer, a third conducting layer, a fifth insulating layer, a fourth conducting layer, a sixth insulating layer, a fifth conducting layer, a seventh insulating layer, a sixth conducting layer, an eighth insulating layer and a pixel definition layer that are sequentially stacked, the data connecting lines are located in the sixth conducting layer, and the display panel further comprises a supply voltage signal line extending parallel to the data connecting lines, wherein the supply voltage signal line is located in the fourth conducting layer.

5. The display panel according to claim 1, wherein the data connecting lines further comprise a second-type data connecting line extending along the second direction, the display panel further comprises an initialization supply voltage signal line extending along the second direction, the second-type data connecting line at least partially overlaps with the initialization supply voltage signal line, and a width of the second-type data connecting line is smaller than a width of the initialization supply voltage signal line.

6. The display panel according to claim 1, further comprising a drive circuit layer disposed on the substrate, wherein the drive circuit layer comprises a first semiconductor layer, a first conducting layer and a second semiconductor layer, the first semiconductor layer is a low temperature polycrystalline silicon semiconductor layer, the second semiconductor layer is a metal oxide semiconductor layer, the second semiconductor layer is arranged in a polyline and comprises a first transition portion, and a width of the first transition portion is greater than a width of a remaining portion of the second semiconductor layer, and the first gate of the first thin film transistor is located in the first conducting layer, the first conducting layer comprises a scan extending portion, and the scan extending portion at least partially overlaps with the first transition portion.

7. The display panel according to claim 1, wherein at least one of the data connecting lines comprises a dummy data connecting line and an effective data connecting line, the effective data connecting line and one of the data lines are electrically connected to form a path, and the dummy data connecting line is connected to a fixed potential, the display panel further comprises a light-emitting element, wherein at least one of the dummy data connecting line or the effective data connecting line comprises a breaking, and the light-emitting element comprises an anode overlapping with the breaking, an organic light-emitting layer and a cathode.

8. The display panel according to claim 1, further comprising a light-emitting element, wherein the data connecting lines comprise first-type data connecting lines and second-type data connecting lines, the first-type data connecting lines comprise a first-type data connecting line electrically connected to a second-type data connecting line of the second-type data connecting lines through an effective connecting structure, connecting structures comprise the effective connecting structure and/or a dummy connecting structure, and the dummy connecting structure comprises a metal pad, the light-emitting element comprises an anode, an organic light-emitting layer and a cathode, the anode overlaps with at least two of the connecting structures, wherein the light-emitting element at least comprises a first light-emitting element and a second light-emitting element, the first light-emitting element comprises a first anode, and the second light-emitting element comprises a second anode, and a number of the connecting structures overlapped with the first anode is the same as a number of the connecting structures overlapped with the second anode.

9. An electronic apparatus comprising a display panel according to claim 1.

10. A display panel comprising:

a substrate comprising a display area and a pad area;

a first thin film transistor comprising a silicon semiconductor pattern and a first gate, wherein the silicon semiconductor pattern comprises a drain area, an active area and a source area, and the first gate overlaps with the active area of the silicon semiconductor pattern;

a second thin film transistor comprising an oxide semiconductor pattern and a second gate, wherein the oxide semiconductor pattern comprises a drain area, an active area and a source area, and the second gate overlaps with the active area of the oxide semiconductor pattern;

data lines extend along a first direction in the display area;

data connecting lines arranged in the display area and located at a side of the second gate away from the substrate, wherein the data connecting lines are connected to the data lines and transmit data signals from the pad area to the data lines; and pixel circuit groups arranged along the first direction and a second direction in the display area, wherein each of the pixel circuit groups comprises a first pixel circuit and a second pixel circuit, and the first pixel circuit and the second pixel circuit are at least partially symmetric with respect to an imaginary axis extending between the first pixel circuit and the second pixel circuit, wherein the data connecting lines comprise a first data connecting line and a second data connecting line, and the first data connecting line and the second data connecting line extend in a same direction as the data lines, and wherein at least one of:

the first data connecting line is arranged in an area of the first pixel circuit, and the second data connecting line is arranged in an area of the second pixel circuit, and the first data connecting line and the second data connecting line are arranged between the first pixel circuit and the second pixel circuit and are adjacent to each other, or the first pixel circuit is connected to a first data line of the data lines, the second pixel circuit is connected to a second data line of the data lines, and the first data line and the second data line are arranged between two adjacent pixel circuit groups and are adjacent to each other.

11. An electronic apparatus comprising a display panel according to claim 10.

12. A display panel, comprising:

a substrate comprising a display area and a pad area;

a first thin film transistor comprising a silicon semiconductor pattern and a first gate, wherein the silicon semiconductor pattern comprises a drain area, an active area and a source area, and the first gate overlaps with the active area of the silicon semiconductor pattern;

a second thin film transistor comprising an oxide semiconductor pattern and a second gate, wherein the oxide semiconductor pattern comprises a drain area, an active area and a source area, and the second gate overlaps with an active area of the oxide semiconductor pattern;

data lines extend along a first direction in the display area;

data connecting lines arranged in the display area and located at a side of the second gate away from the substrate, wherein the data connecting lines are connected to the data lines and transmit data signals from the pad area to the data lines; and pixel circuit groups arranged along the first direction and a second direction in the display area, wherein each of the pixel circuit groups comprises a first pixel circuit and a second pixel circuit, and the first pixel circuit and the second pixel circuit are at least partially symmetric with respect to an imaginary axis extending between the first pixel circuit and the second pixel circuit, wherein the data connecting lines comprise a first data connecting line and a second data connecting line, and the first data connecting line and the second data connecting line extend in a same direction as the data lines, and the first data connecting line is arranged in an area of the first pixel circuit, and the second data connecting line is arranged in an area of the second pixel circuit, and the first data connecting line and the second data connecting line are arranged between the first pixel circuit and the second pixel circuit and are adjacent to each other.

13. The display panel according to claim 12, wherein for each of the pixel circuit groups, the first pixel circuit is connected to a first data line of the data lines, the second pixel circuit is connected to a second data line of the data lines, the first data line and the second data line are arranged between the first pixel circuit and the second pixel circuit and are adjacent to each other, a first trace group comprises the first data line and the second data line, a second trace group comprises the first data connecting line and the second data connecting line, and the first trace group and the second trace group are arranged alternately along the second direction.

14. The display panel according to claim 12, wherein the data lines and the data connecting lines are disposed in a same layer, the display panel further comprises a drive circuit layer disposed on the substrate, wherein the drive circuit layer comprises a first semiconductor layer, a first insulating layer, a first conducting layer, a second insulating layer, a second conducting layer, a third insulating layer, a second semiconductor layer, a fourth insulating layer, a third conducting layer, a fifth insulating layer, a fourth conducting layer, a sixth insulating layer, a fifth conducting layer, a seventh insulating layer, a sixth conducting layer, an eighth insulating layer and a pixel definition layer that are sequentially stacked, and the data connecting lines are located in the sixth conducting layer.

15. The display panel according to claim 12, wherein the data connecting lines comprise first-type data connecting lines comprising the first data connecting line and the second data connecting line, and second-type data connecting lines extending along the second direction, and the second-type data connecting lines are located at a side of the first-type data connecting lines adjacent to the substrate, the display panel further comprises a shielding portion disposed in a same layer with the second-type data connecting lines, wherein the shielding portion as a whole extends in the second direction and is connected to a fixed potential, the pixel circuit groups comprise scanning lines extending along the second direction, the shielding portion at least partially overlaps with at least one of the scanning lines, the first thin film transistor is a drive transistor, and the shielding portion comprises a first convex portion protruding along the first direction and extending toward the first thin film transistor, and wherein the first convex portion is connected to a supply voltage signal line through a via, the shielding portion further comprises a second convex portion protruding along the first direction and extending away from the first thin film transistor, and the second convex portion at least partially overlaps with the second thin film transistor, the display panel further comprises a drive circuit layer disposed on the substrate, wherein the drive circuit layer comprises a first semiconductor layer and a second semiconductor layer, the first semiconductor layer is a low temperature polycrystalline silicon semiconductor layer, the second semiconductor layer is a metal oxide semiconductor layer, the second semiconductor layer is arranged in a polyline and comprises a first transition portion, and a width of the first transition portion is greater than a width of a remaining portion of the second semiconductor layer, and the second convex portion at least partially overlaps with the first transition portion.

16. The display panel according to claim 12, wherein the data connecting lines comprise: first-type data connecting lines comprising the first data connecting line and the second data connecting line, and a second-type data connecting line extending along the second direction, the display panel further comprises an initialization supply voltage signal line extending in the second direction, the second-type data connecting line at least partially overlaps with the initialization supply voltage signal line, and a width of the second-type data connecting line is smaller than a width of the initialization supply voltage signal line.

17. The display panel according to claim 12, wherein the first pixel circuit and the second pixel circuit share a supply voltage signal line, and the supply voltage signal line is located in a same layer as the data connecting lines.

18. The display panel according to claim 12, wherein the display panel further comprises a drive circuit layer disposed on the substrate, the drive circuit layer at least comprises a first semiconductor layer, a first insulating layer, a first conducting layer, a second insulating layer, a second conducting layer, a third insulating layer, a second semiconductor layer, a fourth insulating layer, a third conducting layer, a fifth insulating layer, and a fourth conducting layer that are sequentially stacked, the first semiconductor layer is a low temperature polycrystalline silicon semiconductor layer, and comprises a silicon semiconductor pattern of a first light-emitting control transistor, the silicon semiconductor pattern of the first light-emitting control transistor comprising a drain area, an active area and a source area, and a storage capacitor comprises a first plate and a second plate, the second conducting layer comprises the second plate of the storage capacitor, and the fourth conducting layer comprises a supply voltage connecting portion comprising a first end connected to the second plate of the storage capacitor through a via, and a second end connected to the source area of the first light-emitting control transistor through another via, the supply voltage connecting portion is located between and shared by adjacent pixel circuit groups of the pixel circuit groups; or wherein the display panel further comprises a light-emitting element, the data connecting lines comprise: first-type data connecting line comprising the first data connecting line and the second data connecting line, and second-type data connecting lines extending along the second direction, and the first-type data connecting lines comprise a first-type data connecting line electrically connected to a second-type data connecting line of the second-type data connecting lines through an effective connecting structure, connecting structures comprise the effective connecting structure and/or a dummy connecting structure, and the dummy connecting structure comprises a metal pad, the light-emitting element comprises an anode, an organic light-emitting layer and a cathode, the anode overlaps with at least two of the connecting structures, and the light-emitting element at least comprises a first light-emitting element and a second light-emitting element, the first light-emitting element comprises a first anode, and the second light-emitting element comprises a second anode, and a number of the connecting structures overlapped with the first anode is the same as a number of the connecting structures overlapped with the second anode.

19. The display panel according to claim 12, wherein at least one of:

at least one of the data connecting lines comprises a dummy data connecting line and an effective data connecting line, the effective data connecting line and one of the data lines are electrically connected to form a path, and the dummy data connecting line is connected to a fixed potential; or the display panel further comprises a light-emitting element, wherein at least one of the dummy data connecting line or the effective data connecting line comprises a breaking, and the light-emitting element comprises an anode overlapping with the breaking, an organic light-emitting layer and a cathode.

20. An electronic apparatus comprising a display panel according to claim 12.

* * * * *